US008063562B2

(12) United States Patent
Gomi

(10) Patent No.: US 8,063,562 B2
(45) Date of Patent: Nov. 22, 2011

(54) LIGHT-EMITTING DEVICE AND ELECTRONIC APPARATUS

(75) Inventor: Tsugio Gomi, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 399 days.

(21) Appl. No.: 12/254,951

(22) Filed: Oct. 21, 2008

(65) Prior Publication Data
US 2009/0128016 A1 May 21, 2009

(30) Foreign Application Priority Data

Nov. 19, 2007 (JP) ................................. 2007-298923
Nov. 20, 2007 (JP) ................................. 2007-300202

(51) Int. Cl.
H01L 23/053 (2006.01)
H01L 23/10 (2006.01)

(52) U.S. Cl. ......... 313/512; 313/498; 313/500; 313/504

(58) Field of Classification Search .................. 313/512, 313/498–511; 445/23–25
See application file for complete search history.

(56) References Cited

U.S. PATENT DOCUMENTS

| 2003/0122476 A1* | 7/2003 | Wang et al. | 313/493 |
| 2007/0132382 A1* | 6/2007 | Lee et al. | 313/512 |
| 2007/0176550 A1* | 8/2007 | Kwan | 313/512 |
| 2007/0232182 A1* | 10/2007 | Park | 445/25 |

FOREIGN PATENT DOCUMENTS

JP A-2002-008855 1/2002

* cited by examiner

Primary Examiner — Joseph L Williams
Assistant Examiner — Nathaniel Lee
(74) Attorney, Agent, or Firm — Oliff & Berridge, PLC

(57) ABSTRACT

A light-emitting device includes a light-emitting element that has at least a light-emitting layer, a switching element that drives the light-emitting element, layered wiring lines that connect at least the light-emitting element and the switching element to each other, a substrate on which the light-emitting element, the switching element, and the layered wiring lines are provided, and a sealing substrate that is provided on the substrate with a plurality of sealing members interposed therebetween, and covers the light-emitting element. The plurality of sealing members include first and second sealing members. The first sealing member surrounds the periphery of the light-emitting element and is provided so as to at least partially overlap surface regions of the substrate where the light-emitting element, the switching element, and the layered wiring lines are provided. The second sealing member surrounds the periphery of the first sealing member.

8 Claims, 20 Drawing Sheets

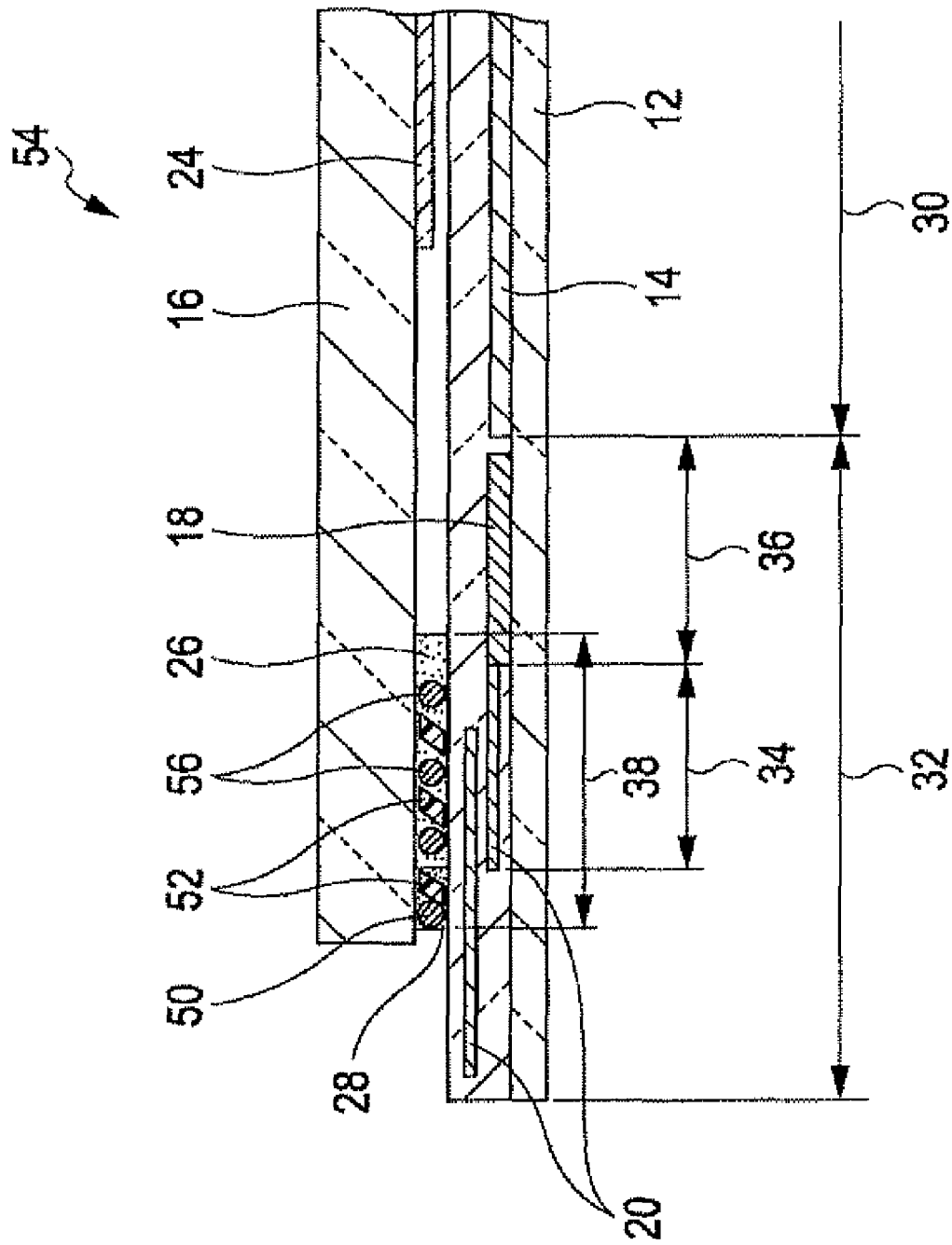

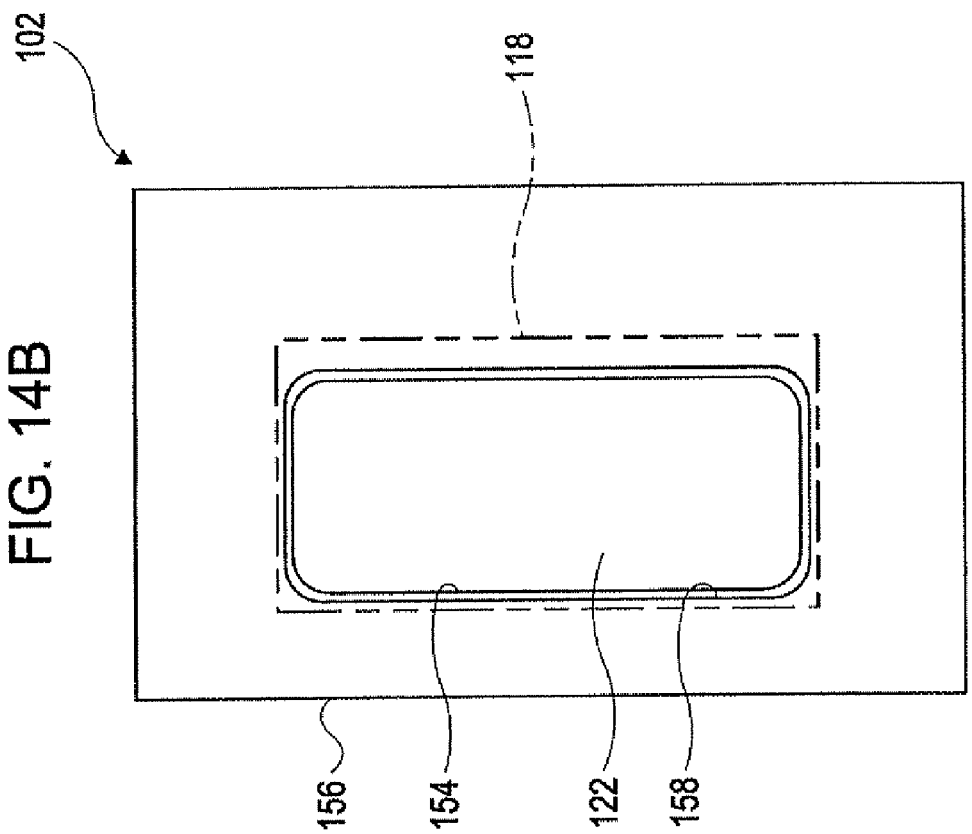
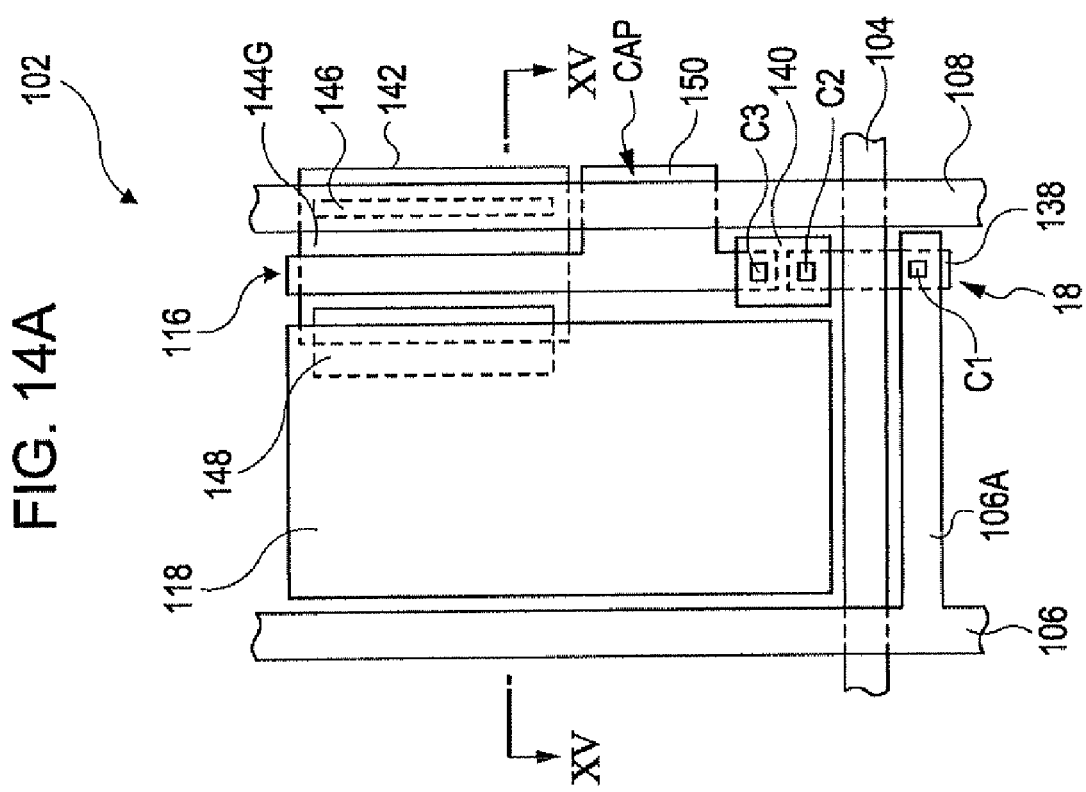

LIGHT-EMITTING DEVICE AND ELECTRONIC APPARATUS

BACKGROUND

1. Technical Field

The present invention relates to a light-emitting device and an electronic apparatus.

2. Related Art

In recent years, light-emitting devices have been widely used in display devices and electrophotographic image forming apparatuses as exposure devices. A light-emitting device includes a light-emitting element, such as an organic EL element (organic electroluminescence elements).

In a light-emitting device, durability against long-term light-emission is demanded, and dark spots lead to deterioration of the light-emission characteristics of the organic EL element. Dark spots are generated when water adhering to the surface of each of the constituent parts of an organic EL element, water (moisture) having permeated the organic EL element, or atmosphere gas, such as oxygen, permeates a laminate having a transparent electrode, a light-emitting layer (organic layer), and a rear electrode sequentially laminated through defect in the surface of the rear electrode, and disconnection occurs between the organic layer and the rear electrode.

For such a light-emitting device, in order to achieve an improvement in reliability and long lifespan for the organic EL element and, it is important to make the light-emitting layer or the electrodes constituting the organic EL element be reliably isolated from the atmosphere gas. For this purpose, a known technology is used to bond a substrate (transparent substrate) having an organic EL element formed thereon and a sealing member as a single body using an adhesive, to thereby protect the sealed organic EL element from the atmosphere gas. In order to suppress permeation of water as much as possible and prevent the light-emitting element from being deteriorated (sealing performance), the adhesive is preferably applied over a large width (seal area). In general, the seal performance increases in proportion to the width of the region in which the adhesive is applied.

For example, a light-emitting device disclosed in JP-A-2002-8855 is known in which a transparent electrode made of ITO serving as an anode, an organic layer made of an organic compound having at least a light-emitting layer, and a non-transmissive rear electrode made of aluminum (Al) serving as a cathode are sequentially laminated on a substrate made of a glass material, thereby forming a laminate. In addition, a concave sealing member made of a glass material is provided on the substrate in an airtight manner by applying an adhesive to cover the laminate, and an absorbent is provided on a surface of the sealing member facing the laminate. The absorbent is made of a compound, which chemically absorbs water and maintains a solid state even when water is absorbed.

In recent years, as shown in FIG. 21, as typified by a display panel of a mobile phone, a frame region 300 (a region excluding a display region 302 corresponding to a surface on which a light-emitting element 303 is to be provided) needs to be provided so as to be as narrow as possible. However, in order to provide a narrow frame, it is necessary to reduce the width of a seal region 306 where a sealing member 304 is provided. If the seal region 306 becomes too narrow, the sealing performance is deteriorated. That is, it is difficult to provide a narrow frame while ensuring adequate sealing performance. The sealing member 304 contains a gap material (silica, plastic, or the like) 314 so as to maintain a gap 312 between a sealing substrate 308 and a substrate 310 constant. Furthermore, in order to increase a moisture-proof property or to control the elastic modulus of the sealing member 304 to thereby increase workability, the sealing member 304 contains a filler (silica or the like) 316. Accordingly, when the sealing substrate 308 and the substrate 310 are bonded to each other, pressure is applied. In this case, when the sealing member 304 is coated on a multilayer wiring region 322 where a plurality of wiring lines 320 are laminated, leakages or short-circuits may occur between the wiring lines 320 due to the gap material 314 or the filler 316. Meanwhile, when the sealing member 304 is coated on a switching element region 326 where a switching element 324 is provided, the switching element 324 may not normally function, and the characteristics may be deteriorated. For this reason, it is necessary to separately arrange the seal region 306 so as not to overlap the display region 302, the multilayer wiring region 322, and the switching element region 326.

SUMMARY

The invention can be embodied as the following aspects.

According to a first aspect of the invention, a light-emitting device includes a light-emitting element that has at least a light-emitting layer, a switching element that drives the light-emitting element, layered wiring lines that connect at least the light-emitting element and the switching element to each other, a substrate on which the light-emitting element, the switching element, and the layered wiring lines are provided, and a sealing substrate that is provided on the substrate with a plurality of sealing members interposed therebetween, and covers the light-emitting element. The plurality of sealing members include first and second sealing members. The first sealing member surrounds the periphery of the light-emitting element and is provided so as to at least partially overlap surface regions of the substrate where the light-emitting element, the switching element, and the layered wiring lines are provided. The second sealing member surrounds the periphery of the first sealing member.

With this configuration, the first sealing member can be provided so as to partially overlap the surface region of the substrate where the light-emitting element, the switching element, and the layered wiring lines are provided. When the width of the adhesive is set to be the same as that of a known device, it is possible to make the frame width narrow, and as a result it is possible to provide a size-reduced organic EL device. In addition, when the frame width is the same as that of a known device, the seal width can be increased. For this reason, sealing performance can be improved and accordingly the element can be prevented from being deteriorated. Therefore, it is possible to provide an organic EL device that has a long lifespan. Furthermore, even though the frame width is narrow, it is possible to provide an organic EL device that is compact and has high sealing performance and a long lifespan.

In the light-emitting device according to the first aspect of the invention, the second sealing member may contain a granular material, and the first sealing member may contain no granular material.

With this configuration, it becomes easy to effectively prevent the light-emitting element, the switching element, and the layered wiring lines from being damaged due to the first sealing member. In addition, the second sealing member makes it easy to effectively set a gap between the substrate and the sealing substrate.

In the light-emitting device according to the first aspect of the invention, the first sealing member may contain a first granular material, the second sealing member may contain a second granular material, and the first granular material may have a smaller volume than that of the second granular material.

With this configuration, it becomes easy to effectively prevent the light-emitting element, the switching element, and the layered wiring lines from being damaged due to the first sealing member. In addition, the second sealing member makes it easy to effectively set a gap between the substrate and the sealing member.

According to a second aspect of the invention, a light-emitting device includes a light-emitting element that has at least a light-emitting layer, a switching element that drives the light-emitting element, layered wiring lines that connect at least the light-emitting element and the switching element to each other, a substrate on which the light-emitting element, the switching element, and the layered wiring lines are provided, and a sealing substrate that is provided on the substrate with a sealing member interposed therebetween, and covers the light-emitting element. The sealing substrate has a concave portion and a convex portion at a surface thereof opposed to the substrate. The concave portion surrounds the periphery of the light-emitting element and is provided so as to at least partially overlap surface regions of the substrate where the light-emitting element, the switching element, and the layered wiring lines are provided. The convex portion is provided at the periphery of the concave portion. The sealing member surrounds the periphery of the light-emitting element, and is at least partially provided in the concave portion and the convex portion.

With this configuration, the sealing member can be provided so as to partially overlap the surface region of the substrate where the light-emitting element, the switching element, and the layered wiring lines are provided. When the width of the adhesive is set to be the same as that of a known device, it is possible to make the frame width narrow, and as a result it is possible to provide a size-reduced organic EL device. In addition, when the frame width is the same as that of a known device, the seal width can be increased. For this reason, sealing performance can be improved and accordingly the element can be prevented from being deteriorated. Therefore, it is possible to provide an organic EL device that has a long lifespan. Furthermore, even though the frame width is narrow, it is possible to provide an organic EL device that is compact and has high sealing performance and a long lifespan.

According to a third aspect of the invention, an electronic apparatus includes the above-described light-emitting device, and a control unit that controls the light-emitting device.

With this configuration, by using the above-described light-emitting device, it is possible to provide an electronic apparatus that is compact and has a long lifespan.

BRIEF DESCRIPTION OF THE DRAWINGS

The invention will be described with reference to the accompanying drawings, wherein like numbers reference like elements.

FIG. 7 is a partially enlarged sectional view of an organic EL device according to a second embodiment of the invention.

FIGS. 14A and 14B are plan views showing one pixel region in the organic EL display according to Example 1.

DESCRIPTION OF EXEMPLARY EMBODIMENTS

Figure 1A:
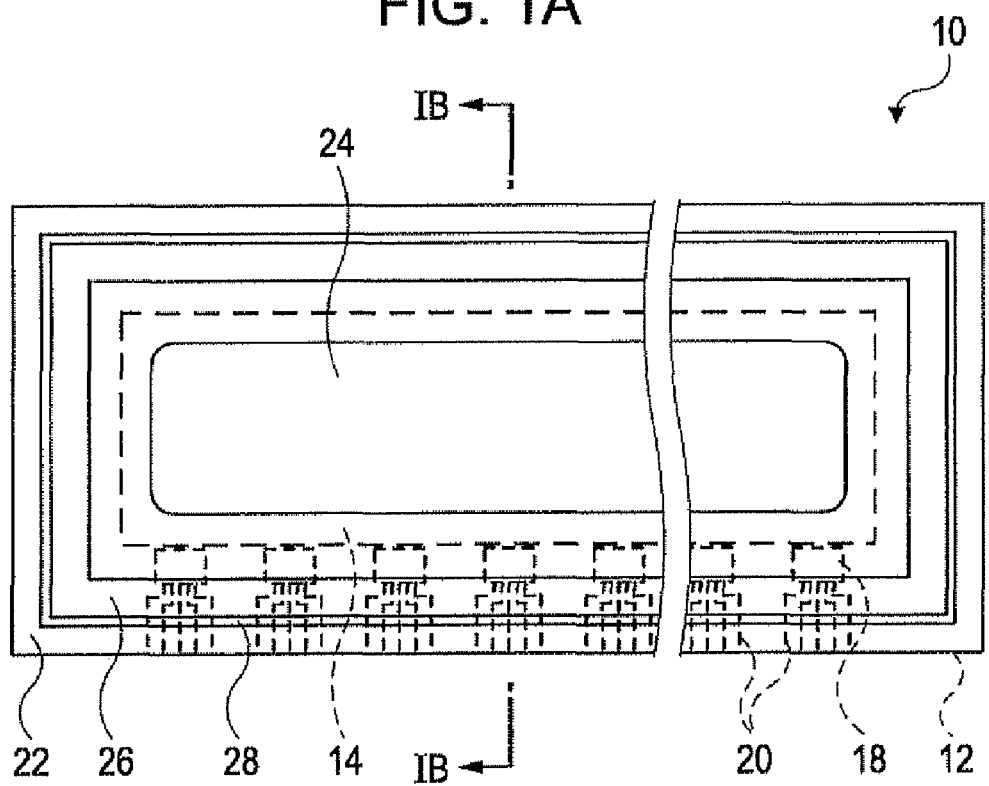
FIGS. 1A and 1B are a plan view and a sectional view of an organic EL device according to a first embodiment of the invention.

Hereinafter, embodiments of the invention will be described with reference to the drawings. In the drawings, the scales of layers or members have been adjusted so as to be recognizable.

First Embodiment

Organic EL Device

Figure 1B:
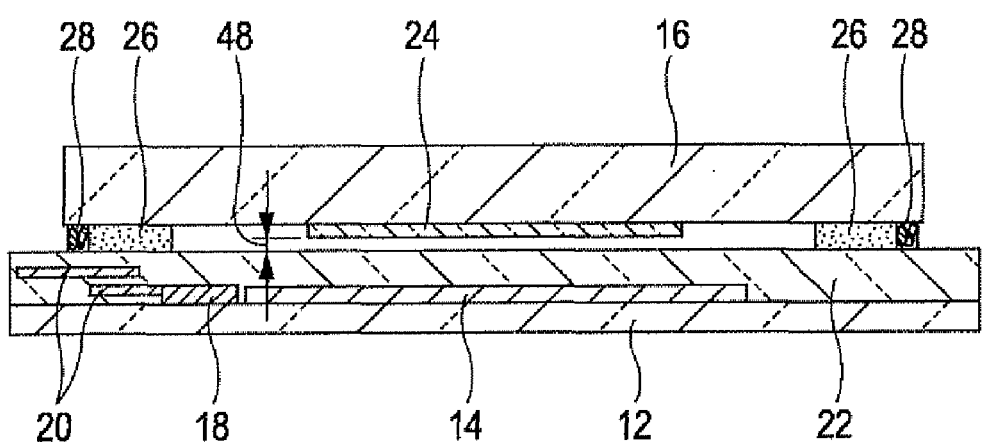

FIG. 1A is a plan view of an organic EL device (organic electroluminescence device) 10 serving as a light-emitting device according to a first embodiment of the invention. FIG. 1B is a sectional view taken along the line IB-IB of FIG. 1A.

As shown in FIGS. 1A and 1B, the organic EL device 10 of this embodiment primarily includes a substrate 12, a light-emitting element 14 provided on the substrate 12, and a sealing substrate 16 arranged to be opposed to the substrate 12 with the light-emitting element 14 interposed therebetween. In addition to the light-emitting element 14, provided on the substrate 12 are a switching element (thin film transistor) 18 for driving the light-emitting element 14, layered wiring lines 20 that connect at least the light-emitting element 14 and the switching element 18, and an interlayer insulating layer 22 that covers the light-emitting element 14, the switching element 18, and the layered wiring lines 20. Provided between the substrate 12 and the sealing substrate 16 are also an absorbent 24 arranged to be opposed to the light-emitting element 14, a first sealing member 26 arranged to surround the light-emitting element 14, and a second sealing member 28 arranged to surround the first sealing member 26. In FIG. 1A, for ease of understanding, the sealing substrate 16 is not shown.

The organic EL device 10 of this embodiment may be used in both a bottom emission type device, in which light emitted from the light-emitting element 14 is extracted to the outside through the substrate 12, and a top emission type device, in which light emitted from the light-emitting element 14 is extracted to the outside through the sealing substrate 16. In case of the bottom emission type device, the substrate 12 is made of a light-transmissive transparent or translucent material, for example, transparent glass, quartz, sapphire, or transparent synthetic resin, such as polyester, polyacrylate, polycarbonate, or polyether ketone. In case of the top emission type device, the interlayer insulating layer 22, the absorbent 24, and the sealing substrate 16 are made of a transparent or light-transmissive material.

Figure 2:
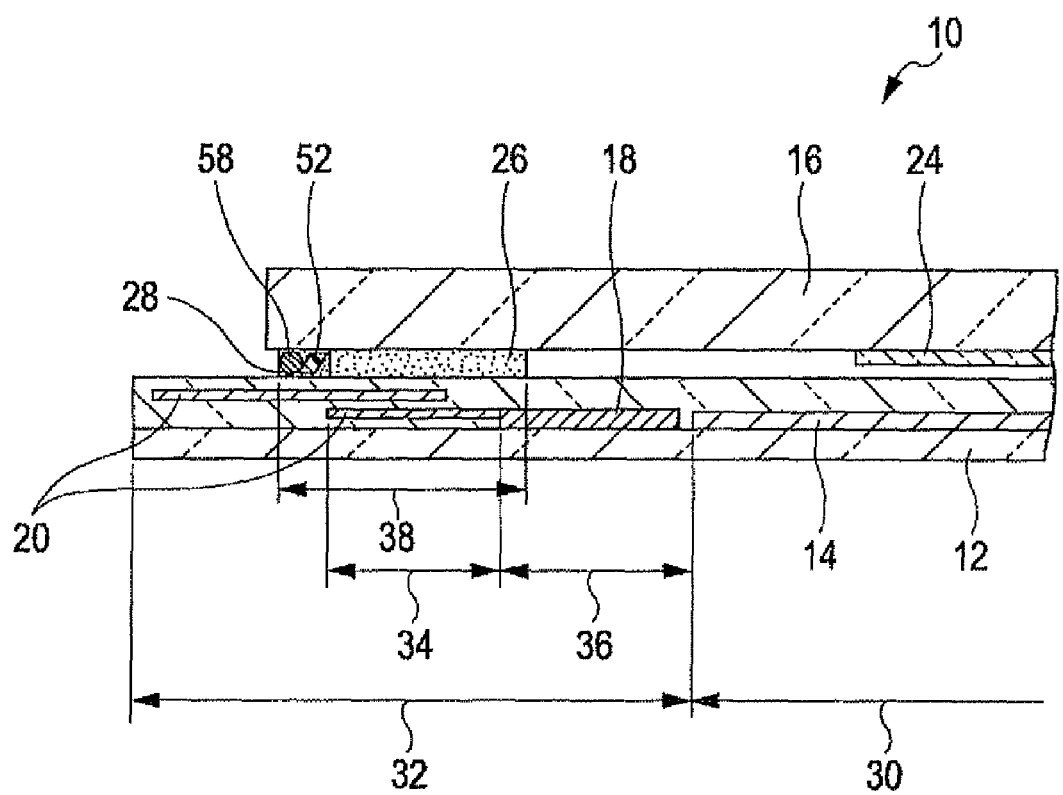
FIG. 2 is a partially enlarged sectional view of the organic EL device according to the first embodiment.

FIG. 2 is a partially enlarged sectional view of the organic EL device (organic electroluminescence device) 10 serving as an example of the light-emitting device according to the first embodiment. As shown in FIG. 2, the organic EL device 10 has a display region 30, a frame region 32, a multilayer wiring region 34, a switching element region 36, and a seal region 38.

The display region 30 corresponds to a surface region of the substrate 12 where the light-emitting element 14 is provided. The frame region 32 refers to a region excluding the display region 30 on the substrate 12. The multilayer wiring region 34 corresponds to a surface region of the substrate 12 where the layered wiring lines 20 are provided. The switching element region 36 corresponds to a surface region of the substrate 12 where the switching element 18 is provided. The seal region 38 corresponds to a surface region of the substrate 12 where the first and second sealing members 26 and 28 are provided.

The first sealing member 26 in the seal region 38 is provided so as to surround the periphery of the light-emitting element 14. The first sealing member 26 is provided so as to at least partially overlap the surface regions of the substrate 12 where the light-emitting element 14, the switching element 18, and the layered wiring lines 20 are provided. In order words, the seal region 38 is provided so as to at least partially overlap the display region 30, the multilayer wiring region 34, and the switching element region 36. The second sealing member 28 is provided so as to surround the periphery of the first sealing member 26.

Returning to FIG. 1A, the sealing substrate 16 is provided on the substrate 12 with a plurality of sealing members interposed therebetween and covers the light-emitting element 14. The sealing substrate 16 is adhered to the substrate 12 by the first sealing member 26 and the second sealing member 28, which is provided so as to surround the periphery of the first sealing member 26, thereby sealing the light-emitting element 14. The sealing substrate 16 preferably has a function of favorably protecting the light-emitting element 14, and is made of, for example, a material having low water permeability, such as glass, quartz, synthetic resin, or metal. Examples of glass include soda-lime glass, lead alkali glass, borosilicate glass, aluminosilicate glass, and silica glass. Examples of synthetic resin include transparent synthetic resin, such as polyolefin, polyester, polyacrylate, polycarbonate, polyether ketone. Examples of the metal include aluminum and stainless steel. If a glass substrate is used as the sealing substrate 16 and covers the light-emitting element 14, it is possible to favorably prevent water (moisture) or oxygen from permeating into the light-emitting element 14.

Figure 3:
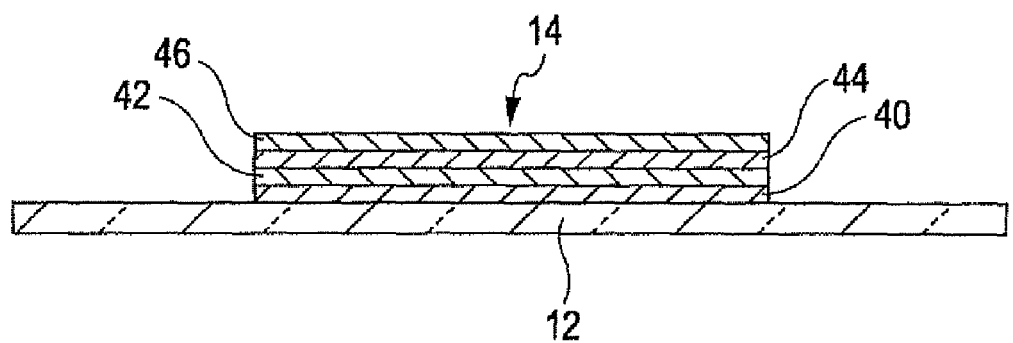
FIG. 3 is a sectional view illustrating a manufacturing process of the organic EL device according to the first embodiment.

The light-emitting element 14 is an organic EL element in which an organic functional layer including an organic light-emitting layer made of an electro-optical material is sandwiched between two electrode films individually serving as first and second electrodes on the substrate 12. As shown in FIG. 3, the light-emitting element 14 has a laminate structure including an anode 40, a hole transport layer 42, a light-emitting layer 44, and a cathode 46. The light-emitting element 14 may be modified in various ways according to the purpose of the organic EL device 10. In the case of providing illumination, the light-emitting element 14 has a planar shape. In the case of forming a display unit of an electronic apparatus, a plurality of light-emitting elements 14 are substantially arranged in a matrix in plan view. In the case of forming an exposure unit of a printer, a plurality of light-emitting elements 14 are arranged in a line or in multiple lines.

Returning to FIG. 1, the interlayer insulating layer 22 is formed by a thin film made of an inorganic insulating material, and has a function of preventing water from permeating into the light-emitting element 14. Examples of a material for the interlayer insulating layer 22 include silicon oxynitride (SiON), silicon dioxide ($SiO_2$), and silicon nitride (SiN).

The absorbent 24 is provided on the sealing substrate 16. The absorbent 24 is provided to substantially have a rectangular shape in plan view to correspond to the interlayer insulating layer 22 substantially having a rectangular shape in plan view. In this embodiment, the absorbent 24 is formed to substantially have a rectangular shape in plan view, but the absorbent 24 may be formed to have a frame shape in accordance with the shape of the light-emitting element 14 or the interlayer insulating layer 22 or may be formed to have an arbitrary shape surrounding the light-emitting element 14. In this embodiment, as shown in FIG. 1B, the absorbent 24 is provided to be opposed to the interlayer insulating layer 22 at a predetermined gap 48, and comes into contact with the sealing substrate 16, from among the substrate 12 and the sealing substrate 16 sandwiching the absorbent 24. That is, the absorbent 24 preferably maintains predetermined planar and sectional shapes. For example, if an absorbent material (dehydrating agent or deoxidant) capable of absorbing water (moisture) or oxygen is dispersed into a binder, such as resin, wax, or fatty oil, the absorbent may have good formability.

As the absorbent material, a material that substantially does not react with an organic compound constituting the binder is used. Examples of the binder include calcium hydride, strontium hydride, barium hydride, aluminum lithium hydride, sodium oxide, potassium oxide, calcium oxide, barium oxide, and magnesium oxide.

As the binder, resin, wax, and fatty oil may be used. Specific examples of the binder include resin materials, such as polyethylene resin and polypropylene resin, petroleum-derived wax, such as paraffin wax and micro-crystalline was, plant-derived wax, animal-derived wax, mineral-derived wax, fatty acid, fatty acid ester, fatty acid amide, and aliphatic amine.

when a mixture of a binder and an absorbent material is not used for the absorbent 24, if a sealed space including the gap 48 between the substrate 12 and the sealing substrate 16 has a desired absorption function, various absorbent materials may be used regardless of the above limitation. For example, silica gel, zeolite, activated charcoal, calcium oxide, germanium oxide, phosphorous pentoxide, and calcium chloride may be used alone or in combination. If the gap 48 is provided, even though water (moisture) or oxygen passes through the first sealing member 26 and permeates the gap 48, water (moisture) or oxygen can be diffused into the gap 48, and thus a load on the absorbent 24 can be made uniform on its peripheral surface. Therefore, according to the above-described configuration, a good absorption effect can be obtained over the long term, and reliability and durability of the organic EL device can be improved.

The first sealing member 26 is provided on the sealing substrate 16. The first sealing member 26 is formed to have a rectangular frame shape in plan view to surround the periphery of the light-emitting element 14 and is sandwiched between the substrate 12 and the sealing substrate 16. In this embodiment, the first sealing member 26 functions as an adhesive for adhering the substrate 12 and the sealing substrate 16. As the material for the first sealing member 26, any material may be used insofar as it can maintain stable adhesion strength and provide good airtightness. Examples of the material for the first sealing member 26 include photosetting epoxy resin, which is hardened by UV irradiation, cationic materials, such as epoxy and vinyl ether, acrylate, such as ester acrylate and urethane acrylate, and radical materials, such as urethane polyester.

The first sealing member 26 is preferably made of a material having a small elastic modulus, specifically, a material having a smaller elastic modulus than that of the second sealing member 28. If the first sealing member 26 has a smaller elastic modulus than that of the second sealing member 28, the sealing substrate 16 can be supported by the second sealing member 28, and as a result it is difficult to easily form the first sealing member 16.

The first sealing member 26 contains no granular material (s gap material, such as a spacer), which separates the substrate 12 and the sealing substrate 16 from each other by a predetermined gap. With this configuration, it is possible to prevent the light-emitting element 14, the switching element 18, and the layered wiring lines 20 from being damaged due to a pressing force when the sealing substrate 16 is adhered. The first sealing member 26 may contain a filter (silica or the like) in order to increase a moisture-proof property and to control the elastic modulus of the first sealing member 26 to thereby increase workability.

The second sealing member 28 is provided on the sealing substrate 16. The second sealing member 28 is formed to have a rectangular frame shape in plan view to surround the periphery of the first sealing member 26 and is sandwiched between the substrate 12 and the sealing substrate 16. In this embodiment, the second sealing member 28 functions as an adhesive for adhering the substrate 12 and the sealing substrate 16. As the material for the second sealing member 28, similarly to the first sealing member 26, any material may be used insofar as it can maintain stable adhesion strength and provide good airtightness. For example, a thermosetting resin material may be used. As the material for the second sealing member 28, photosetting epoxy resin, which is hardened by UV irradiation, may also be used.

The second sealing member 28 is preferably made of a material having lower water (moisture)/oxygen permeability than the first sealing member 26. As such, if the outermost periphery of the device is covered with a material having low water (moisture)/oxygen permeability, it is possible to reduce the amount of water (moisture) or oxygen reaching the absorbent 24, and thus it is possible to reduce the amount of water reaching the light-emitting element 14. At the same time, it is possible to extend a time until water (moisture) or oxygen reaches the light-emitting element 14. As a result, a long lifespan can be achieved for the light-emitting element 14.

Unlike the first sealing member 26, the second sealing member 28 contains a granular material (a gap material, such as a spacer) 50, which separates the substrate 12 and the sealing substrate 16 from each other by a predetermined gap. With this configuration, it is possible to prevent the light-emitting element 14 from being damaged due to a pressing force when the sealing substrate 16 is adhered. The second sealing member 28 may contain a filler (silica or the like) 52, similarly to the first sealing member 26.

As described above, the organic EL device 10 of this embodiment has a double sealed structure provided by the first and second sealing members 26 and 28, such that good sealing performance with respect to the light-emitting element 14 can be achieved. Therefore, the first sealing member 26 can be provided so as to at least partially overlap the surface regions of the substrate 12 where the light-emitting element 14, the switching element 18, and the layered wiring lines 20 are provided. When the width of the adhesive is set to be the same as that of a known device, it is possible to make the frame width narrow, and as a result it is possible to provide a size-reduced organic EL device. In addition, when the frame width is the same as that of a known device, the seal width can be increased. For this reason, sealing performance can be improved and accordingly the element can be prevented from being deteriorated. Therefore, it is possible to provide an organic EL device that has a long lifespan. Furthermore, even though the frame width is narrow, it is possible to provide an organic EL device that is compact and has high sealing performance and a long lifespan.

Manufacturing Method of Organic EL Device

Figure 4A:
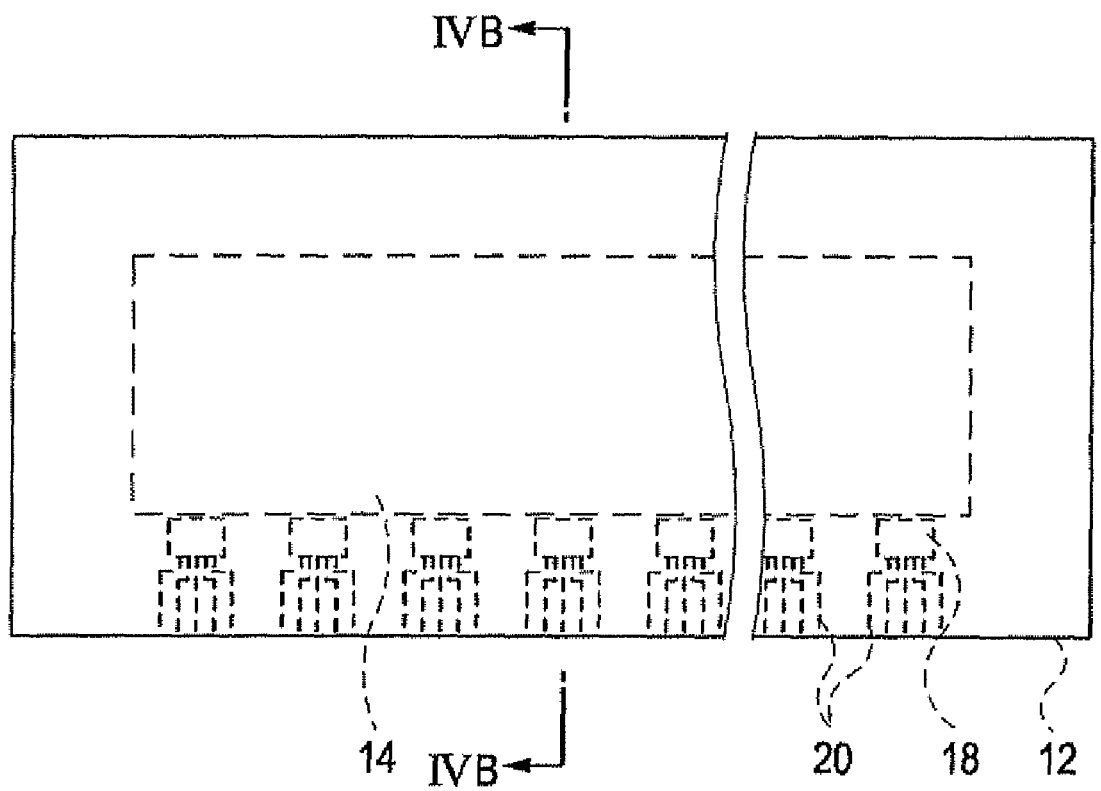
FIGS. 4A and 4B are a plan view and a sectional view illustrating a manufacturing process of the organic EL device according to the first embodiment.
Figure 4B:
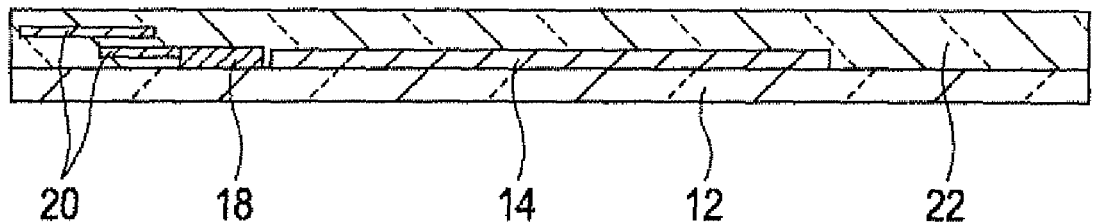
Figure 5A:
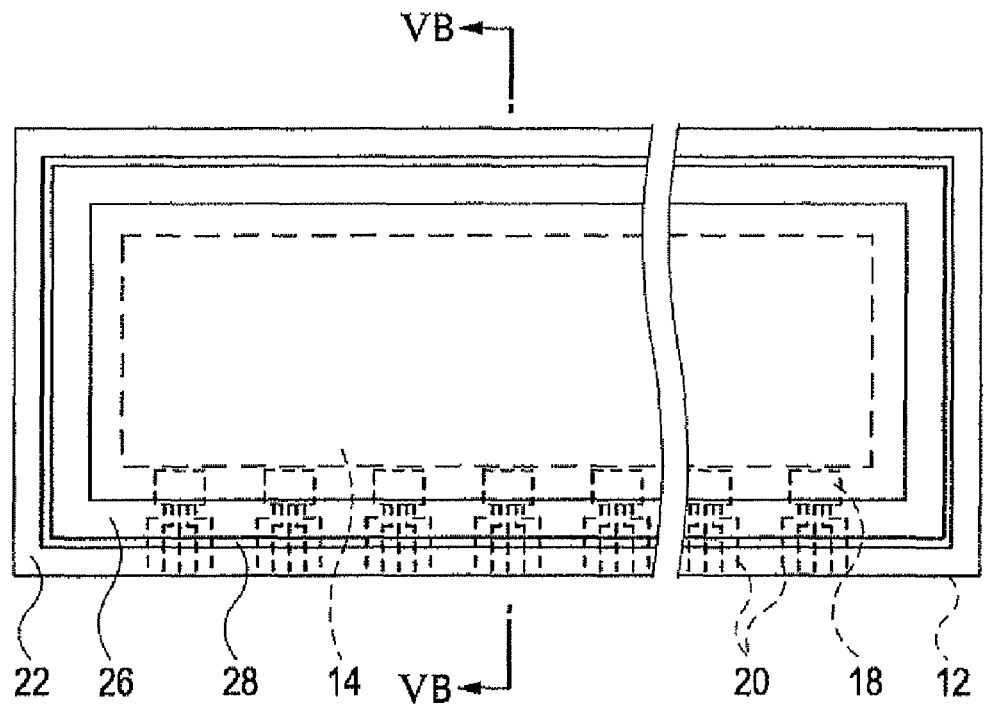
FIGS. 5A and 5B are a plan view and a sectional view illustrating a manufacturing process of the organic EL device according to the first embodiment.
Figure 5B:
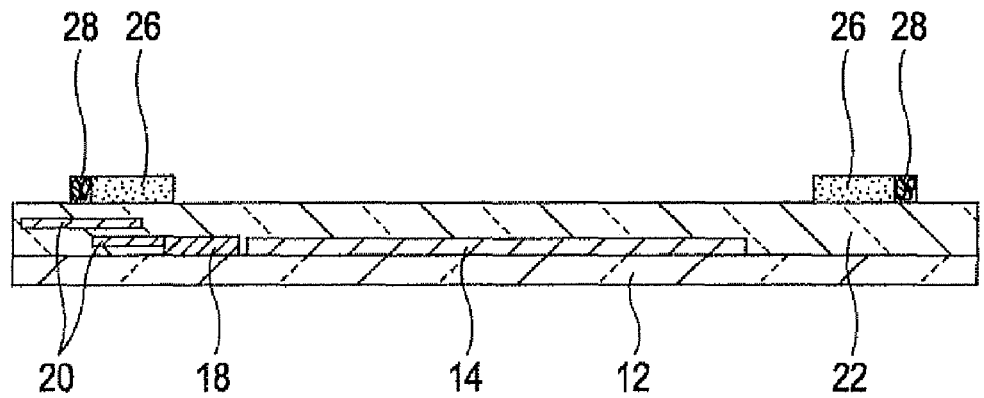
Figure 6A:
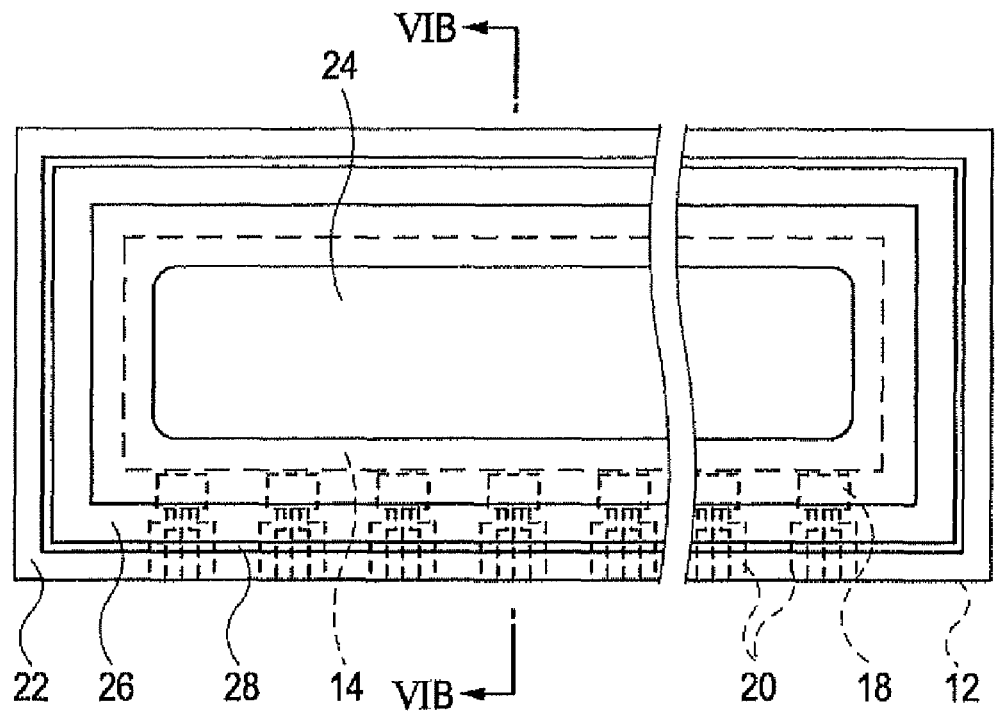
FIGS. 6A and 6B are a plan view and a sectional view illustrating a manufacturing process of the organic EL device according to the first embodiment.
Figure 6B:
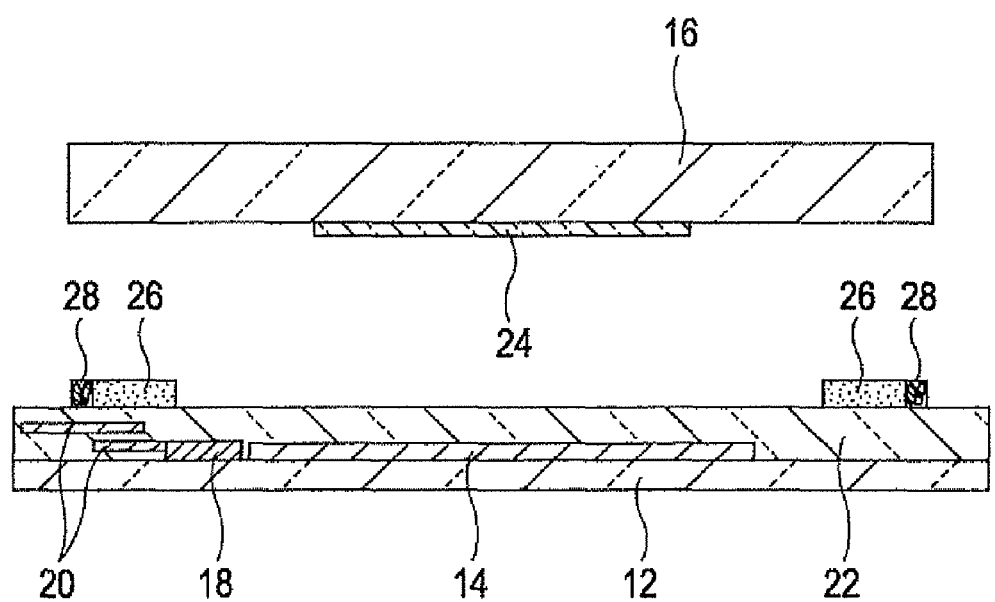

Next, a method of manufacturing the organic EL device 10 having the above-described configuration will be described with reference to schematic views of FIGS. 3 to 6B. FIGS. 4A, 5A, and 6A are plan views showing individual steps in the manufacturing process, and FIGS. 4B, 5B, and 6B are sectional views taken along the lines IVB-IVB, VB-VB, and VIB-VIB of FIGS. 4A, 5A, and 6A, respectively. In FIG. 6A, for ease of understanding, the sealing substrate 16 is not shown.

First, as shown in FIG. 3, the light-emitting element 14 is formed on the substrate 12. Though not shown in FIG. 3, the switching element 18 (see FIG. 4B) for driving and controlling the light-emitting element 14 may be formed in advance on the substrate 12 on which the light-emitting element 14 is to be formed.

The light-emitting element 14 may be formed by sequentially laminating the anode 40, the hole transport layer 42, the light-emitting layer 44, and the cathode 46 in a predetermined region on the substrate 12. In the light-emitting element 14 having such a laminate structure, if a driving signal is supplied from the switching element 18, current flows between the anode 40 and the cathode 46, and the light-emitting layer 44 emits light. In the case of the bottom emission type device, light is emitted through the outer surface of the transparent substrate 12.

In the laminate structure of FIG. 3, the anode 40 is connected to the switching element 18 (not shown) and injects holes into the hole transport layer 42 in accordance with a voltage applied from the switching element 18. As the material for the anode 40, a transparent conductive material, such as ITO (Indium Tin Oxide), or a metal material, such as aluminum or silver, may be used.

The hole transport layer 42 transports and injects the holes from the anode 40 into the light-emitting layer 44. The hole transport layer 42 may be made of a known material. For example, polythiophene, polyaniliner or polypyrrole may be used. Specifically, 3,4-polyethylenedeoxythiophene/polystyrenesulfonic acid (PEDOT/PSS) may be used.

The light-emitting layer 44 emits light by recombination of holes injected from the hole transport layer 42 and electrons injected from the cathode 46. As the material for the light-emitting layer 44, a known light-emitting material capable of emitting fluorescence or phosphorescence may be used. For example, polysilanes, such as polyfluorene derivatives (PF), (poly)paraphenylenevinylene derivatives (PPV), polyphenylene derivatives (PP), polyparaphenylene derivatives (PPP), polyvinylcarbazole (PVK), polythiophene derivatives, and polymethylphenylsilane (PMPS), may be used.

An electron transport layer may be provided between the light-emitting layer 44 and the cathode 46. The electron transport layer ensures improvement of electron injection efficiency from the cathode 46 to the light-emitting layer 44. As the material for the electron transport layer, oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, 8-hydroxyquinoline and metal complexes of derivatives may be used.

The cathode 46 is made of a metal material having a low work function, such as aluminum (Al), magnesium (Mg), gold (Au), silver (Ag), or calcium (Ca), which can efficiently inject electrons into the light-emitting layer 44. The cathode 46 may have a laminate structure of a metal film made of the metal material and a transparent electrode film made of ITO.

In providing the layers of the light-emitting element 14, for example, a known method, such as photolithography or liquid droplet ejection, may be used. Therefore, the light-emitting element 14 having the layers laminated in a predetermined region on the substrate 12 can be provided.

In forming the anode 40 and the cathode 46 made of a metal material or a transparent conductive material, sputtering, vapor deposition, or photolithography may be used. In forming the hole transport layer 42 and the light-emitting layer 44 made of a high-molecular-weight material, liquid droplet ejection may be used.

In liquid droplet ejection, a material for forming a functional layer is liquidized, and the liquid is quantitatively ejected by using a liquid droplet ejecting apparatus, such as a dispenser or an ink jet apparatus, thereby coating the material in a desired region. Specifically, in a state where the nozzles provided in a liquid droplet ejecting head (ink jet head) are opposed to the substrate 12, the droplets of the liquid are ejected from the nozzles with control of the amount of liquid per droplet while the nozzles and the substrate 12 are moved relative to each other, thereby forming a film pattern of the liquid in a desired pattern on the substrate 12.

If the hole transport layer 42 or the light-emitting layer 44 is formed by liquid droplet ejection, it is possible to reduce manufacturing costs. That is, according to liquid droplet ejection, a material can be arranged in a desired local region on the substrate 12. Therefore, as compared with photolithography, a film forming process can be simplified, and wastage of the materials being used can be suppressed.

After the light-emitting element 14 is formed on the substrate 12, as shown in FIGS. 4A and 4B, the interlayer insulating layer 22 is coated on the light-emitting element 14, the switching element 18, and the layered wiring lines 20 by using a predetermined method. In this embodiment, the interlayer insulating layer 22 is coated on the surface of the light-emitting element 14 by using a film formation method, such as ion plating or sputtering. In this way, the interlayer insulating layer 22 is connected to the surface of the light-emitting element 14 so as to cover the light-emitting element 14. If the interlayer insulating layer 22 of a predetermined thickness is coated on the surface of the light-emitting element 14, even when the organic EL device 10 is being manufactured, it is possible to prevent the light-emitting element 14 from being in contact with water, and as a result, the light-emitting element 14 is favorably sealed.

Next, as shown in FIGS. 5A and 5B, the first and second sealing members 26 and 28 having a rectangular frame shape in plan view is formed along the edge of a surface of the substrate 12 on which the light-emitting element 14 is provided. For example, a resin material, such as epoxy resin, is coated in a planar shape shown in FIG. 5A by using a dispenser or an ink jet apparatus. At this time, the resin material for the second sealing member 28 contains a spacer (the granular material 50) for adjusting the gap between the substrate 12 and the sealing substrate 16. Examples of the spacer include glass beads, resin beads, and the like. Alternatively, the resin material for the first sealing member 26 may not contain a spacer (the granular material 50) for adjusting the gap between the substrate 12 and the sealing substrate 16. In order to prevent the light-emitting element 14 from being deteriorated, the steps are preferably performed under an atmosphere of inert gas, such as nitrogen gas or argon gas.

The resin material disposed on the substrate 12 is preferably brought into close contact with the sealing substrate 16 when the sealing substrate 16 is disposed in a subsequent step, thereby obtaining sealability. For this reason, the resin material is maintained to be adhered to the sealing substrate 16 in a subsequent step.

Alternatively, after being coated on the substrate 12, the resin material may be hardened (temporal hardening) to an extent that adhesiveness is not deteriorated. Temporal hardening increases the viscosity of the resin material forming the first and second sealing members 26 and 28, and ensures that the shapes of the first and second sealing members 26 and 28 are favorably maintained on the substrate 12. Therefore, yield can be prevented from being lowered due to the defective shapes of the first and second sealing members 26 and 28, and the handleability of the substrate in a subsequent step can be improved.

Next, as shown in FIGS. 6A and 6B, a desiccant forming material substantially having a rectangular shape is disposed on the sealing substrate 16 inside the first sealing member 26 so as to be opposed to the interlayer insulating layer 22, thereby forming the absorbent 24. As the desiccant forming material, a mixture of an absorbent material and a binder is preferably used, as described above. If the desiccant forming material is coated by using a dispenser or an ink jet apparatus, as shown in FIGS. 6A and 6B, it is possible to easily form the absorbent 24 having a planar shape.

When being disposed on the sealing substrate 16, the viscosity of the desiccant forming material is preferably 20 Pa·s or more. If a material having a comparatively high viscosity is disposed, it is possible to favorably maintain the shape of the desiccant forming material after it is disposed on the sealing substrate 16. The desiccant forming material preferably has viscosity higher than the resin material for the first sealing member 26, which is to be disposed in a region surrounded by the absorbent 24 in a subsequent step.

After the desiccant forming material is coated on the sealing substrate 16, similarly to the previous step of forming the first and second sealing members 26 and 28, the desiccant forming material may be temporally hardened. Temporal hardening makes it possible to prevent the desiccant forming material from excessively spreading on the sealing substrate 16 as time elapses, and ensures improvement in yield of the organic EL device and the handleability of the substrate.

In this embodiment, the absorbent 24 is provided to be spaced at the gap 48 (see FIG. 1B) away from the interlayer insulating layer 22. If the gap 48 is formed, the gap 48 can be used as a buffer region when the sealing substrate 16 is adhered to the substrate 12. In addition, if the gap 48 is configured to be maintained even after the sealing substrate 16 is adhered, the gap 48 can also function as a region where water or oxygen having passed through the first sealing member 26 and having permeated the device is held. Therefore, it is possible to prevent water or the like from permeating to the inside through the interlayer insulating layer 22.

After the absorbent 24 is formed on the sealing substrate 16, the sealing substrate 16 is adhered onto the substrate 12 (see FIG. 1B). According to the manufacturing process of the organic EL device 10 of this embodiment, a step of disposing the sealing substrate 16 is performed under a reduced pressure environment in order to prevent air bubbles or the like from being mixed between the sealing substrate 16 and the first sealing member 26. After the sealing substrate 16 is adhered, the substrate 12 and the sealing substrate 16 are at atmospheric pressure, such that the sealing substrate 16 is pressed against the light-emitting element 14 by atmospheric pressure. Thereafter, when a thermosetting resin material is used as the resin material for the first sealing member 26, heat is applied to the resin material on the substrate 12.

With these steps, the resin material is hardened to form the first and second sealing members 26 and 28. As a result, it is possible to manufacture the organic EL device 10 in which the sealing substrate 16 is adhered to the substrate 12 by the first and second sealing members 26 and 28.

In this embodiment, when the resin material is disposed on the substrate 12, the absorbent 24 formed on the substrate 12 in advance defines a region where the resin material is to be spread on the substrate 12. Therefore, it is possible to prevent the first sealing member 26 from being thinned less than designed due to the resin material being spread more than necessary. Furthermore, it is possible to suppress occurrence of voids between the sealing substrate 16 and the first sealing member 26.

As described above, according to the manufacturing method of this embodiment, after the interlayer insulating layer 22 is provided on the light-emitting element 14, the resin material or the desiccant forming material is disposed. Therefore, it is possible to prevent the light-emitting element 14 from being deteriorated because a solvent contained in the resin material or the desiccant forming material comes into contact with the light-emitting element 14 during the sealing step. As a result, it is possible to manufacture the organic EL device 10 with a high yield.

Second Embodiment

Next, a second embodiment will be described. This embodiment is different from the foregoing embodiment in that granular materials to be mixed in the first and second sealing member are different in size. Other parts are the same as those in the foregoing embodiment.

FIG. 7 is a partially enlarged sectional view of an organic EL device (organic electroluminescence device) 54 serving as a light-emitting device according to this embodiment. In the organic EL device 54 of this embodiment, as shown in FIG. 7, the first sealing member 26 contains a first granular material (a gap material, such as a spacer) 56, which separates the substrate 12 and the sealing substrate 16 from each other by a predetermined gap. The second sealing member 28 contains a second granular material (a gap material, such as a spacer) 58, which separates the substrate 12 and the sealing substrate 16 from each other by a predetermined gap. The first granular material 56 has a smaller volume than that of the volume of the second granular material 58. With this configuration, it is possible to prevent the switching element 18 and the layered wiring lines 20 from being damaged due to a pressing force when the sealing substrate 16 is adhered.

Third Embodiment

Organic EL Device

Figure 8A:
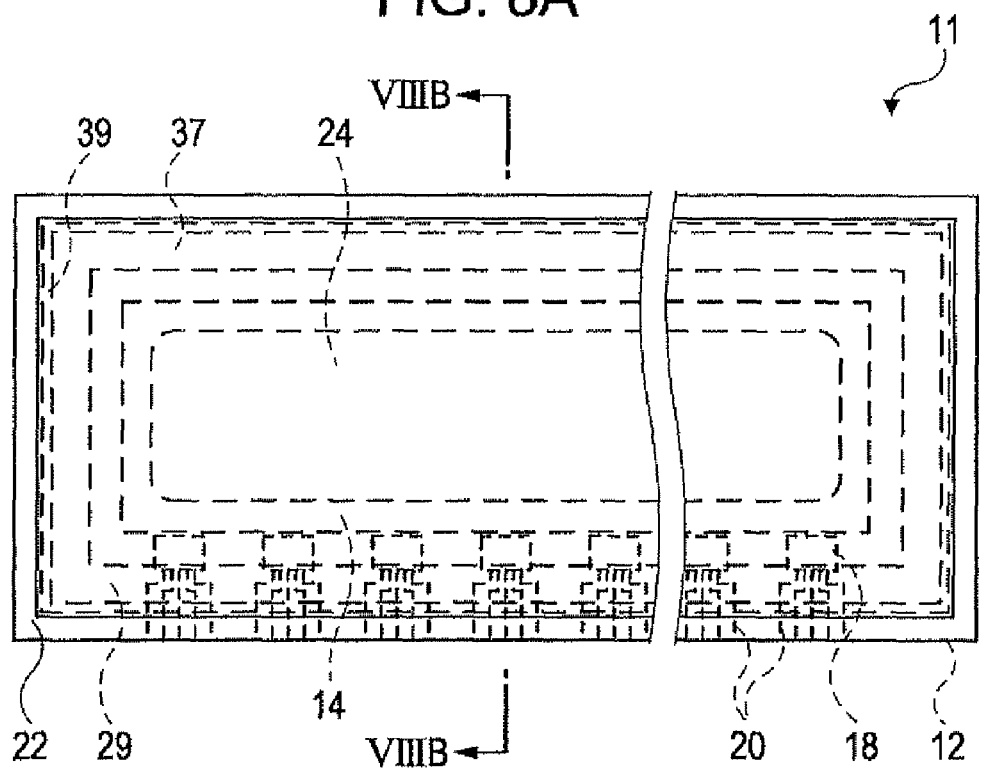
FIGS. 8A and 8B are a plan view and a sectional view of an organic EL device according to a third embodiment of the invention.
Figure 8B:
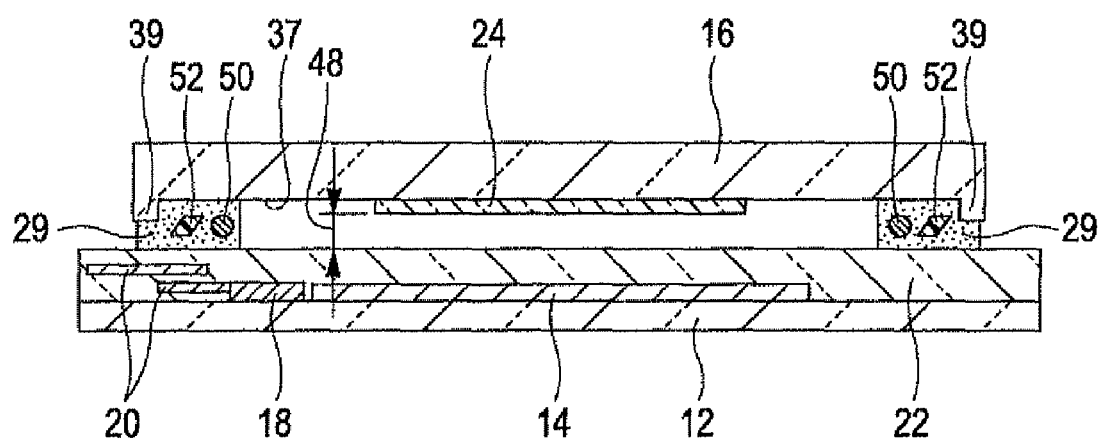

FIG. 8A is a plan view of an organic EL device 11 serving as a light-emitting device according to this embodiment. FIG. 8B is a sectional view taken along the line VIIIB-VIIIB of FIG. 8A. This embodiment is different from the foregoing embodiments in that a surface of the sealing substrate 16 opposed to the substrate 12 has concave and convex portions. Other parts are the same as those in the foregoing embodiments. The organic EL device 11 of this embodiment has the same basic configuration as the organic EL device 10 of the first embodiment. Therefore, the same parts as those in the first embodiment are represented by the same reference numerals, and descriptions thereof will be omitted and shortly described.

In the organic EL device 11 of this embodiment, as shown in FIGS. 8A and 8B, provided between the substrate 12 and the sealing substrate 16 are an absorbent 24 arranged to be opposed to the light-emitting element 14, and a sealing member 29 surrounding the light-emitting element 14.

Figure 9:
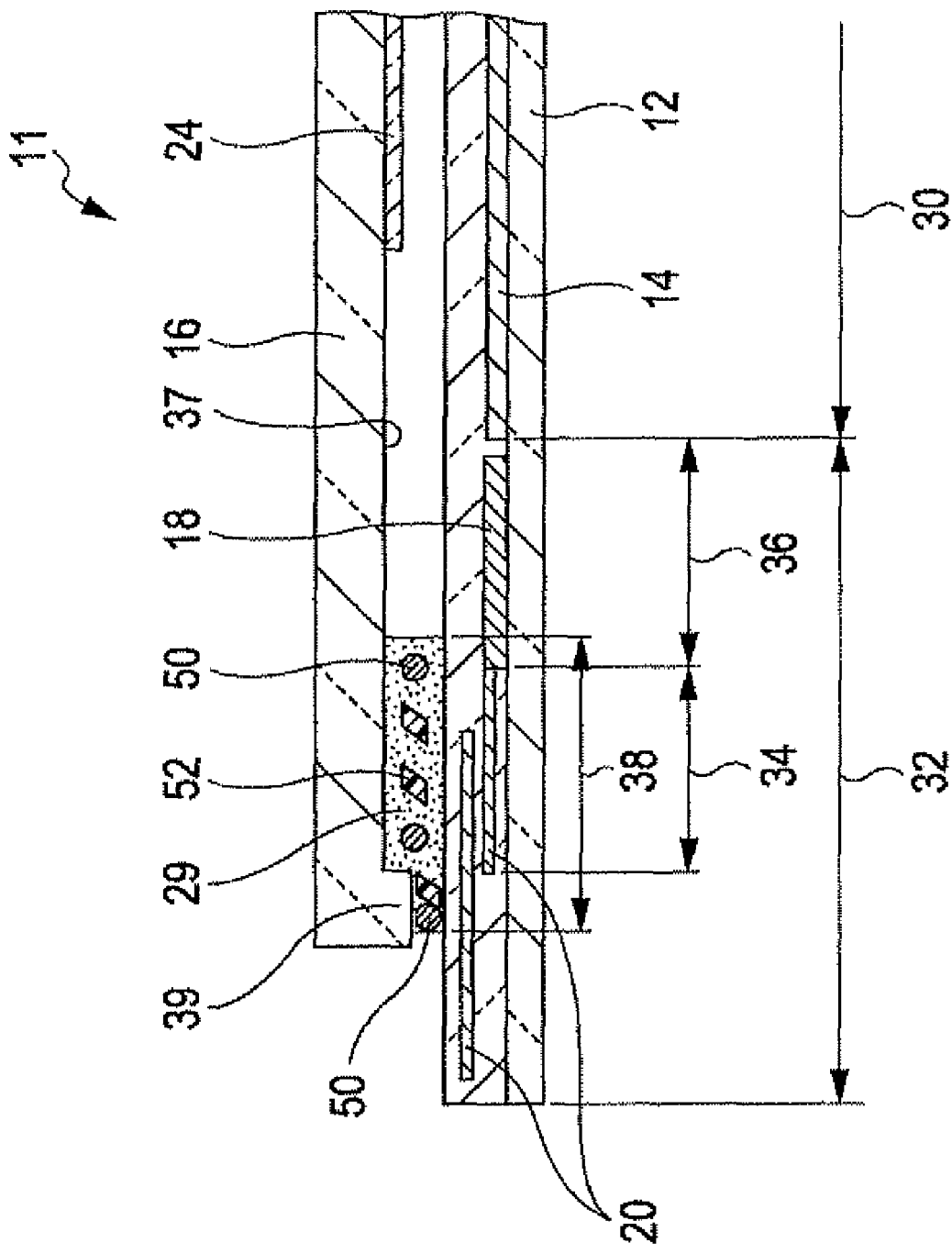
FIG. 9 is a partially enlarged sectional view of the organic EL device according to the third embodiment.

FIG. 9 is a partially enlarged sectional view of the organic EL device 11 serving as a light-emitting device according to this embodiment. As shown in FIG. 9, a seal region 38 corresponds to a surface region of the substrate 12 where the sealing member 29 is provided.

A concave portion 37 and a convex portion 39 are formed at a surface of the sealing substrate 16 opposed to the substrate 12. The concave portion 37 is provided so as to overlap the surface regions of the substrate 12 where the light-emitting element 14, the switching element 18, and the layered wiring lines 20 are provided. In other words, the concave portion 37 is provided so as to at least partially overlap the display region 30, the multilayer wiring region 34, and the switching element region 36. The convex portion 39 is provided at the periphery of the concave portion 37.

The convex portion 39 is provided in the seal region 38. The sealing member 29 in the seal region 38 is provided so as to surround the periphery of the light-emitting element 14. The sealing member 29 is provided in at least part of the concave portion 37. In addition, the sealing member 29 is provided in at least part of the convex portion 39.

Returning to FIG. 8B, the sealing substrate 16 is provided onto the substrate 12 with the sealing member 29 interposed therebetween to cover the light-emitting element 14. The sealing substrate 16 is adhered to the substrate 12 by the sealing member 29, and seals the light-emitting element 14.

When a mixture of a binder and an absorbent material is not used for the absorbent 24, if a sealed space including the gap 48 between the substrate 12 and the sealing substrate 16 has a desired absorption function, various absorbent materials may be used regardless of the above limitation. For example, silica gel, zeolite, activated charcoal, calcium oxide, germanium oxide, phosphorous pentoxide, and calcium chloride may be used alone or in combination. If the gap 48 is provided, even though water (moisture) or oxygen passes through the sealing member 29 and permeates the gap 48, water (moisture) or oxygen can be diffused into the gap 48, and thus a load on the absorbent 24 can be made uniform on its peripheral surface. Therefore, according to the above-described configuration, a good absorption effect can be obtained over the long term, and reliability and durability of the organic EL device can be improved.

The sealing member 29 is provided on the sealing substrate 16. The sealing member 29 is formed to have a rectangular frame shape in plan view to surround the periphery of the light-emitting element 14 and is sandwiched between the substrate 12 and the sealing substrate 16. In this embodiment, the sealing member 29 functions as an adhesive for adhering the substrate 12 and the sealing substrate 16. As the material for the sealing member 29, any material may be used insofar as it can maintain stable adhesion strength and have good airtightness.

The sealing member 29 contains a granular material 50, which separates the substrate 12 and the sealing substrate 16 from each other by a predetermined gap. The granular material 50 functions between the convex portion 39 of a surface of the sealing substrate 16 having provided thereon the sealing member 29 opposed to the substrate 12 sealing member 29 and the substrate 12. Meanwhile, the granular material 50 does not function between the concave portion 37 of the surface of the sealing substrate 16 having provided thereon the sealing member 29 opposed to the substrate 12 and the substrate 12. With this configuration, it is possible to prevent the light-emitting element 14, the switching element 18, and the layered wiring lines 20 from being damaged due to a pressing force when the sealing substrate 16 is adhered. In order to increase a moisture-proof property or to control the elastic modulus of the sealing member 29 to thereby increase workability, the sealing member 29 may contain a filler 52.

As described above, the organic EL device 11 of this embodiment has a sealed structure provided by the convex portion 37 and the concave portion 39 of the sealing substrate 16 having provided thereon the sealing member 29, such that good sealing performance with respect to the light-emitting element 14 can be achieved. Therefore, the sealing member 29 can be provided so as to at least partially overlap the light-emitting element 14, the switching element 18, and the layered wiring lines 20. When the width of the adhesive is set to be the same as that of a known device, it is possible to make the frame width narrow, and as a result it is possible to provide a size-reduced organic EL device.

Manufacturing Method of Organic EL Device

Figure 10A:
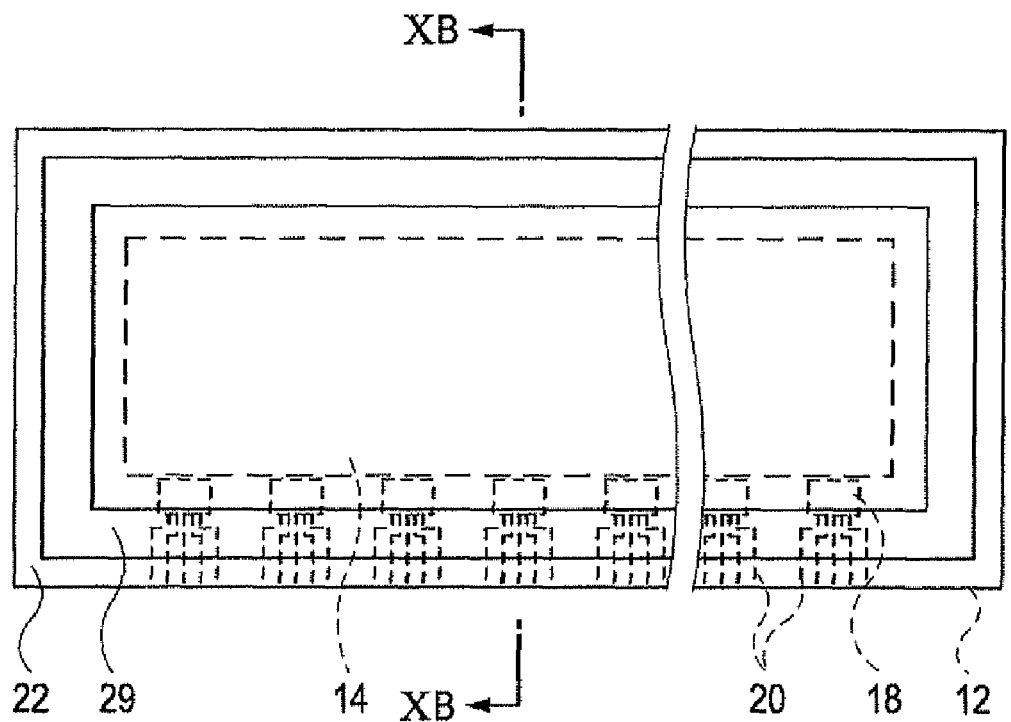
FIGS. 10A and 10B are a plan view and a sectional view illustrating a manufacturing process of the organic EL device according to the third embodiment.
Figure 10B:
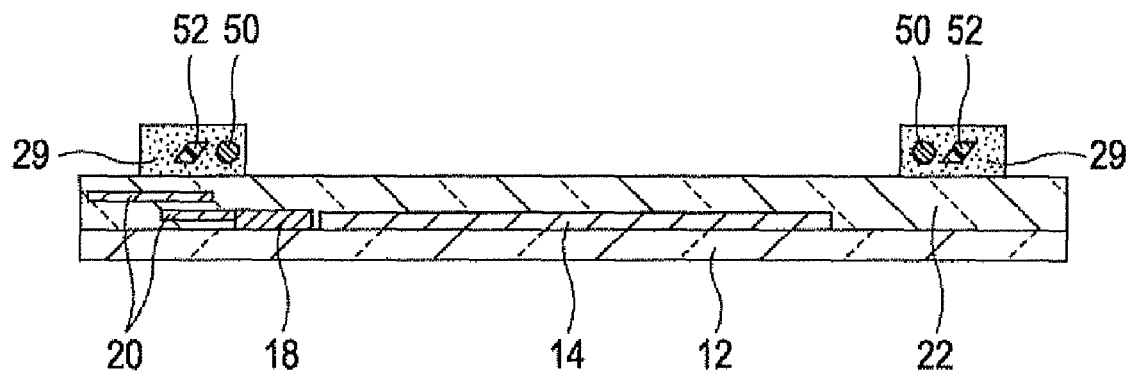
Figure 11A:
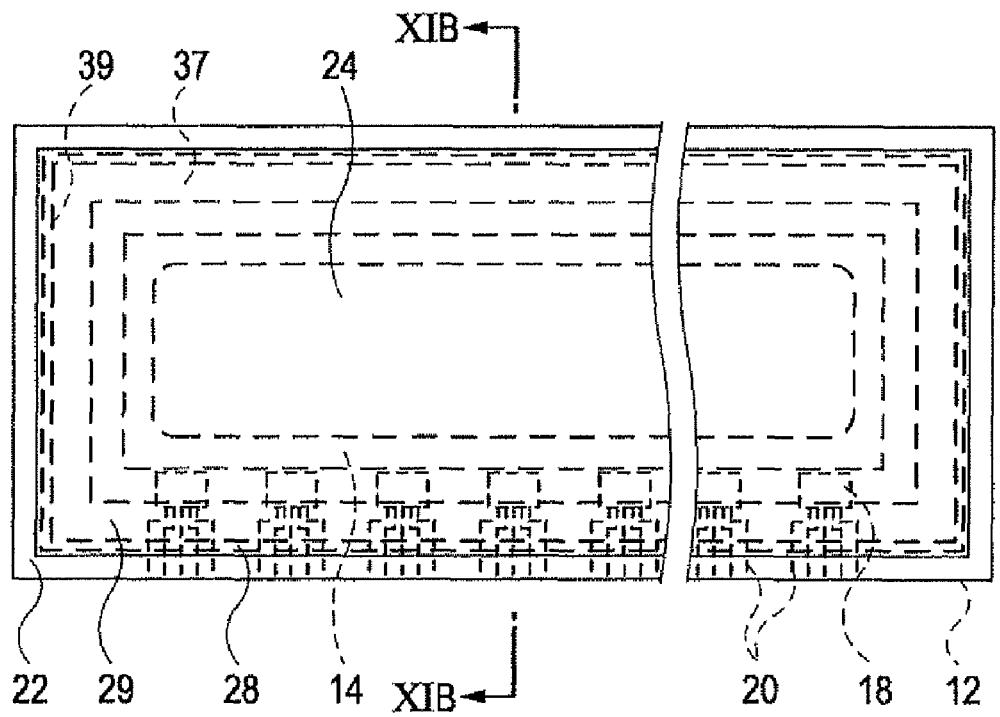
FIGS. 11A and 11B are a plan view and a sectional view illustrating a manufacturing process of the organic EL device according to the third embodiment.
Figure 11B:
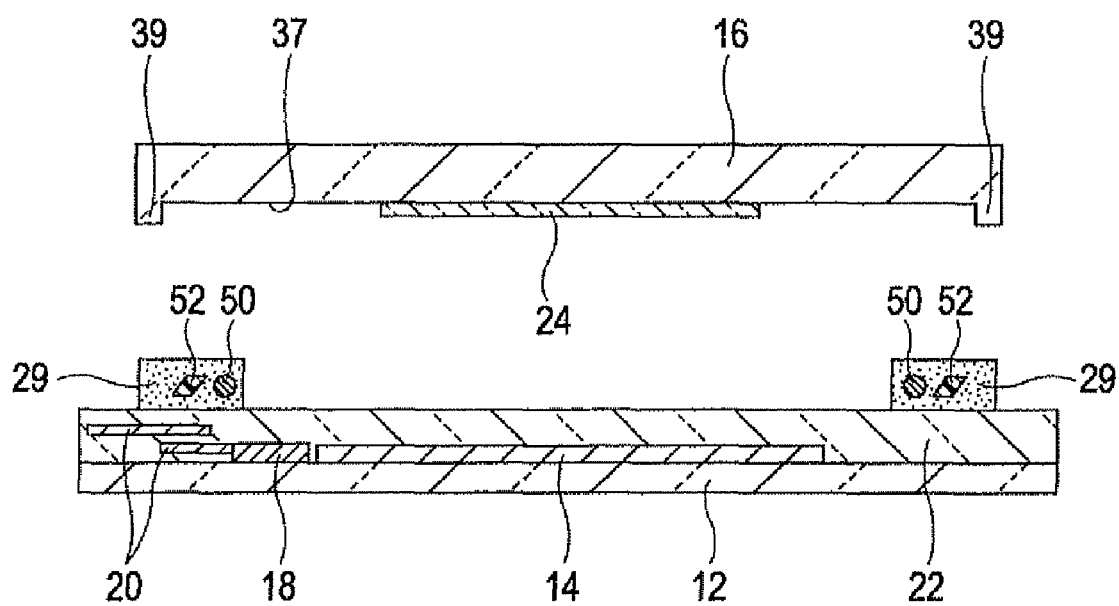

Next, a method of manufacturing the organic EL device 11 having the above-described configuration will be described with reference to schematic views of FIGS. 10A to 11B. FIGS. 10A and 11A are plan views showing individual steps in the manufacturing process, and FIGS. 10B and 11B are sectional views taken along the lines XB-XB and XIB-XIB of FIGS. 10A and 11A, respectively. In FIG. 11A, for ease of understanding, the sealing substrate 16 is not shown.

First, as shown in FIGS. 10A and 10B, the sealing member 29 having a rectangular frame shape in plan view is formed along the edge of a surface of the substrate 12 on which the light-emitting element 14 is provided. For example, a resin material, such as epoxy resin, is coated in a planar shape shown in FIG. 10A by using a dispenser or an ink jet apparatus. At this time, the resin material for the sealing member 29 contains a spacer (the granular material 50) for adjusting the gap between the substrate 12 and the sealing substrate 16.

The resin material disposed on the substrate 12 is preferably brought into close contact with the sealing substrate 16 when the sealing substrate 16 is disposed in a subsequent step, thereby obtaining sealability. For this reason, the resin material is maintained to be adhered to the sealing substrate 16 in a subsequent step.

Alternatively, after being coated on the substrate 12, the resin material may be hardened (temporal hardening) to an extent that adhesiveness is not damaged. Temporal hardening increases the viscosity of the resin material forming the sealing member 29, and ensures the shape of the sealing member 29 to be favorably maintained on the substrate 12. Therefore, yield can be prevented from being lowered due to the defective shape of the sealing member 29, and the handleability of the substrate in a subsequent step can be improved.

Next, as shown in FIGS. 11A and 11B, a desiccant forming material substantially having a rectangular shape is disposed on the sealing substrate 16 inside the sealing member 29 so as to be opposed to the interlayer insulating layer 22, thereby forming the absorbent 24.

The desiccant forming material preferably has viscosity higher than the resin material for the sealing member 29, which is to be disposed in a region surrounded by the absorbent 24 in a subsequent step.

After the desiccant forming material is coated on the sealing substrate 16, similarly to the previous step of forming the sealing member 29, the desiccant forming material may be temporally hardened. Temporal hardening makes it possible to prevent the desiccant forming material from excessively spreading on the sealing substrate 16 as time elapse, and ensures improvement in yield of the organic EL device and the handleability of the substrate.

In this embodiment, the absorbent 24 is provided to be spaced at the gap 48 (see FIG. 8B) away from the interlayer insulating layer 22. If the gap 48 is formed, the gap 48 can be used as a buffer region when the sealing substrate 16 is adhered to the substrate 12. In addition, if the gap 48 is configured to be maintained even after the sealing substrate 16 is adhered, the gap 48 can also function as a region where water or oxygen having passed through the sealing member 29 and having permeated the device is held. Therefore, it is possible to prevent water or the like from permeating to the inside through the interlayer insulating layer 22.

After the absorbent 24 is formed on the sealing substrate 16, the sealing substrate 16 is adhered onto the substrate 12 (see FIG. 8B). According to the manufacturing process of the organic EL device 11 of this embodiment, a step of disposing the sealing substrate 16 is performed under a reduced pressure environment in order to prevent air bubbles or the like from being mixed between the sealing substrate 16 and the sealing member 29. After the sealing substrate 16 is adhered, the substrate 12 and the sealing substrate 16 are at atmospheric pressure, such that the sealing substrate 16 is pressed against the light-emitting element 14 by atmospheric pressure. Thereafter, when a thermosetting resin material is used as the resin material for the sealing member 29, heat is applied to the resin material on the substrate 12.

With these steps, the resin material is hardened to form the sealing member 29. As a result, it is possible to manufacture the organic EL device 11 in which the sealing substrate 16 is adhered to the substrate 12 by the sealing member 29.

In this embodiment, when the resin material is disposed on the substrate 12, the absorbent 24 formed on the substrate 12 in advance defines a region where the resin material spreads on the substrate 12. Therefore, it is possible to prevent the sealing member 29 from being thinned less than as designed due to the spread of the resin material more than necessary.

Furthermore, it is possible to suppress occurrence of a void between the sealing substrate 16 and the sealing member 29.

EXAMPLE 1

Organic EL Display

Next, an organic EL display 100 serving as an example of an organic EL device will be described with reference to FIGS. 12 to 15.

Figure 12:
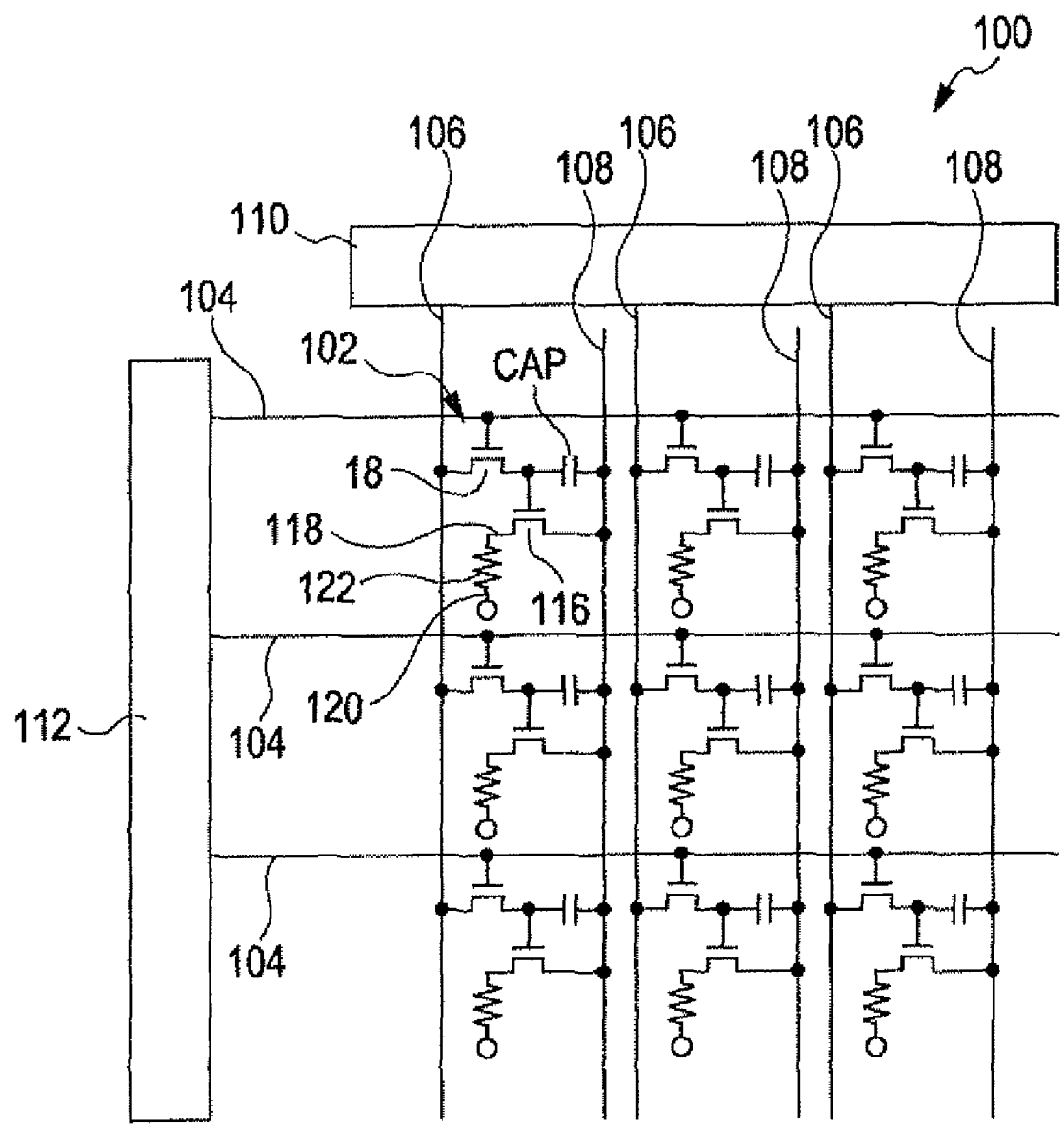
FIG. 12 is a circuit diagram of an organic EL display according to Example 1.
Figure 13:
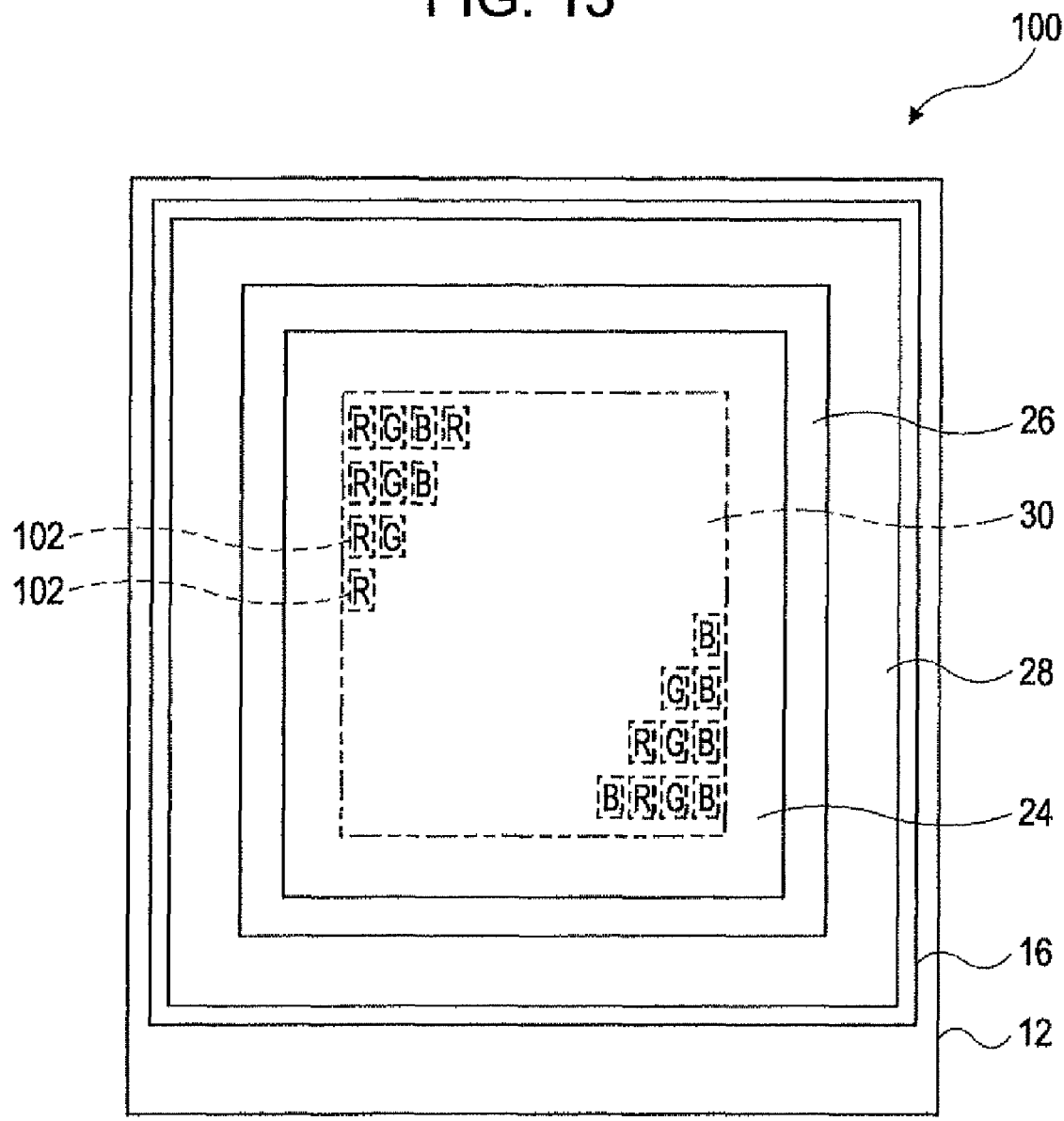
FIG. 13 is a plan view of the organic EL display according to Example 1.
Figure 15:
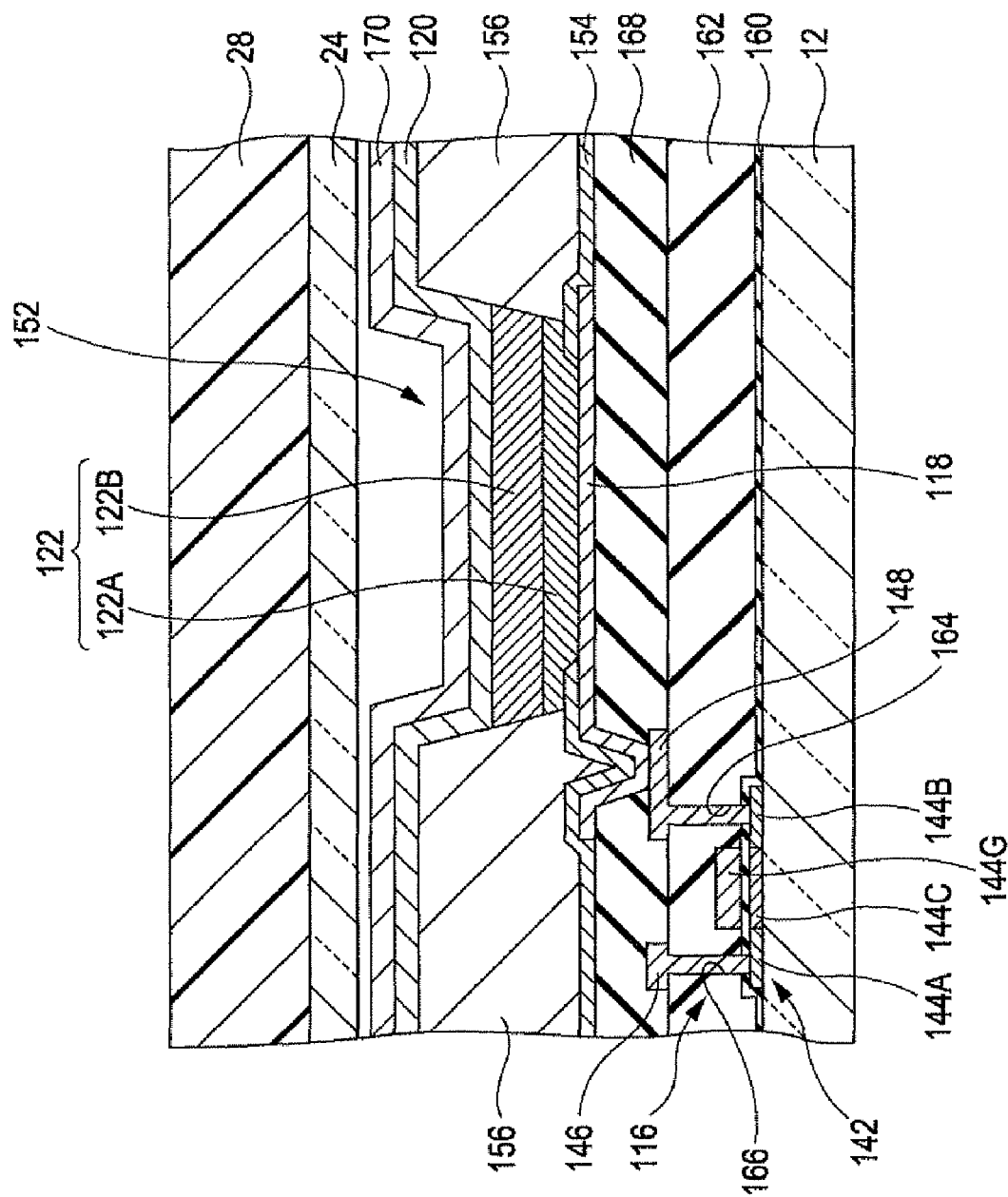
FIG. 15 is a sectional view of one pixel region in the organic EL display according to Example 1.

FIG. 12 is a circuit diagram of the organic EL display 100 of this example. FIG. 13 is a plan view of the same organic EL display. FIGS. 14A and 14B show the planar structure of one pixel 102 in the same organic EL display. Specifically, FIG. 14A is a diagram showing a pixel driving portion including a TFT (Thin Film Transistor) in the pixel 102, and FIG. 14B is a diagram showing a bank (a partition wall member) partitioning each pixel. FIG. 15 is a sectional view taken along the line XV-XV of FIG. 14A.

Referring to the circuit configuration shown in FIG. 12, the organic EL display 100 includes a plurality of scanning lines 104, a plurality of signal lines 106 extending in a direction intersecting the scanning lines 104, and a plurality of common power supply lines 108 extending in parallel with the signal lines 106. The pixels 102 are individually provided at intersections of the scanning lines 104 and the signal lines 106.

In respect to the signal lines 106, a data driving circuit 110 including shift registers, level shifters, video lines, and analog switches is provided. Meanwhile, in respect to the scanning lines 104, a scanning driving circuit 112 including shift registers and level shifters is provided. Each of the pixels 102 is provided with a switching element (Thin Film Transistor) 18 whose gate electrode is supplied with a scanning signal through a corresponding one of the scanning lines 104, a storage capacitor CAP that stores an image signal to be supplied from a corresponding one of the signal lines 106 through the switching element 18, a driving TFT 116 whose gate electrode is supplied with the image signal held by the storage capacitor CAP, a pixel electrode 118 into which a driving current flows from a corresponding one of the common power supply lines 108 when being electrically connected to the corresponding power supply line 108 through the driving TFT 116, and a light-emitting part 122 that is sandwiched between the pixel electrode 118 and a common electrode 120. The organic EL element (light-emitting element) is formed by the pixel electrode 118, the common electrode 120, and the light-emitting part 122.

With this configuration, if the scanning line 104 is driven and the switching element 18 is turned on, a potential on the signal line 106 at that time is held by the storage capacitor CAP. The driving TFT 116 is turned on or off in accordance with the state of the storage capacitor CAP. Current flows from the common power supply line 108 to the pixel electrode 118 through the channel of the driving TFT 116, and then flows into the common electrode 120 through the light-emitting part 122. In this way, the light-emitting part 122 emits light in accordance with the amount of current flowing therein.

Next, referring to the planar configuration shown in FIG. 13, the organic EL display 100 has at the center of a rectangular substrate 12 a display region 30 where a plurality of pixels 102 are arranged in a matrix in plan view. An absorbent 24 is formed to cover the display region 30. A first sealing member 26 having a rectangular frame shape in plan view is provided to surround the display region 30 and the absorbent 24, and a second sealing member 28 having a rectangular frame shape is provided to surround the first sealing member 26. A sealing substrate 16 is arranged so as to planarly cover the display region 30, the absorbent 24, the first sealing member 26, and the second sealing member 28.

That is, the organic EL display 100 is a display device that has the same basic configuration as the organic EL device 10 of the foregoing embodiment. The display region 30 where the pixels 102 are arranged, each pixel having an organic EL element corresponding to the light-emitting element 14 of the organic EL device 10 is double-sealed by the first sealing member 26 and the second sealing member 28.

A gap 48 (see FIG. 1B) is provided between the absorbent 24 and the display region 30. Similarly to the foregoing embodiment, with the gap 48, water having passed through the first sealing member 26 and having permeated the inside is diffused, and a load on the absorbent 24 is made uniform on the peripheral surface. Therefore, the absorbent 24 can be prevented from being locally deteriorated, and the reliability can be improved.

Next, referring to the planar structure of one pixel 102 shown in FIG. 14A, four sides of the pixel electrode 118 substantially having a rectangular shape in plan view in the pixel 102 are surrounded by the signal line 106, the common power supply line 108, the scanning line 104, and a scanning line (not shown) for an adjacent pixel electrode. The switching element 18 and the driving TFT 116 are provided near the pixel electrode 118.

The switching element 18 is a top gate-type thin film transistor primarily formed by a rectangular island-shaped semiconductor layer 138, and the scanning line 104 intersecting the semiconductor layer 138 becomes the gate electrode of the switching element 18 at the intersection. A branch wiring line 106A, which extends along the scanning line 104 from the signal line 106 extending in a vertical direction of FIG. 14A, is electrically connected to the semiconductor layer 138 through a contact hole C1. A relay electrode 140, which has a rectangular shape in plan view and is disposed on the right side of the pixel electrode 118 in FIG. 14A, is electrically connected to the semiconductor layer 138 through a contact hole C2.

The driving TFT 116 is a top gate-type thin film transistor primarily formed by a rectangular island-shaped semiconductor layer 142, and has a gate electrode 144G, a source electrode 146 (part of the common power supply line 108), and a drain electrode 148. The drain electrode 148 is electrically connected to the pixel electrode 118 through a contact hole (not shown; see FIG. 15). The gate electrode 144G extends downward from a position overlapping the semiconductor layer 142, as shown in FIG. 14A, and is formed as a single body with an electrode 150 of the storage capacitor CAP. The electrode 150 extends downward in FIG. 14A, and is electrically connected to the relay electrode 140, which is arranged so as to overlap planarly the electrode 150, through a contact hole C3. Therefore, the gate electrode of the driving TFT 116 is electrically connected to the drain of the switching element 18 through the relay electrode 140.

Referring to the sectional structure of the pixel 102 shown in FIG. 15, the driving TFT 116 is provided on the substrate 12, and an organic EL element 152 is formed on the substrate 12 with a plurality of insulating films formed to cover the driving TFT 116 interposed therebetween. The organic EL element 152 is primarily formed by an organic functional layer (light-emitting part) 122, which is provided within a region surrounded by a bank (an inorganic bank 154 and an organic bank 156). The organic functional layer 122 is sandwiched between the pixel electrode 118 and the common electrode 120. Referring to the planar structure shown in FIG. 14B, the organic bank 156 has an opening 158 substantially having a rectangular shape to correspond to a region where the pixel electrode 118 is to be formed, and the organic functional layer 122 is formed ahead of the opening 158.

As shown in FIG. 15, the driving TFT 116 primarily includes a source region 144A, a drain region 144B, and a channel region 144C, which are formed in the semiconductor layer 142, and the gate electrode 144G arranged to be opposed to the channel region 144C with a gate insulating film 160 formed on the surface of the semiconductor layer 142 interposed therebetween. A first interlayer insulating film 162 is formed to cover the semiconductor layer 142 and the gate insulating film 160. The drain electrode 148 and the source electrode 146 are buried in contact holes 164 and 166, which are formed to pass through the first interlayer insulating film 162 and to reach the semiconductor layer 142, respectively. The drain and source electrodes are conductively connected to the drain region 144B and the source region 144A, respectively. A second interlayer insulating film 168 is formed on the first interlayer insulating film 162, and part of the pixel electrode 118 is buried in a contact, which is formed to pass through the second interlayer insulating film 168. The pixel electrode 118 and the drain electrode 148 are conductively connected to each other, and accordingly the driving TFT 116 and the pixel electrode 118 (the organic EL element 152) are electrically connected to each other.

The inorganic bank (first partition wall layer) 154 made of an inorganic insulating material is formed on the second interlayer insulating film 168. The inorganic bank 154 is disposed to partially extend to the edge of the pixel electrode 118. The organic bank (second partition wall layer) 156 made of an organic material is laminated on the inorganic bank 154, thereby forming a partition wall member in the organic EL device.

The organic EL element 152 is formed by laminating a hole transport layer 122A and a light-emitting layer 122B on the pixel electrode 118 and forming the common electrode 120 to cover the light-emitting layer 122B and the organic bank 156. That is, the organic EL element 152 of this embodiment corresponds to the light-emitting element 14 in the foregoing embodiment. The pixel electrode 118, the hole transport layer 122A, the light-emitting layer 122B, and the common electrode 120 correspond to the anode 40, the hole transport layer 42, the light-emitting layer 44, and the cathode 46 of the light-emitting element 14, respectively.

The hole transport layer 122A is formed to cover the surface of the pixel electrode 118, and the edge thereof covers the end portion of the inorganic bank 154 extending from a lower end of the organic bank 156 toward the center of the pixel electrode 118.

An interlayer insulating film 170 that corresponds to the interlayer insulating layer 22 in the foregoing embodiment is formed on the common electrode 120. The absorbent 24 is formed to cover the interlayer insulating film 170.

Similarly to the organic EL device 10 in the foregoing embodiment, the organic EL display 100 having the above-described configuration is provided with the absorbent 24 and the first and second sealing members 26 and 28. Therefore, the organic EL display 100 has a double sealed structure provided by the first sealing member 26 and the second sealing member 28. As a result, it is possible to provide an organic EL display that achieves good sealing performance with respect to the organic EL element 152, obtains high sealing performance even though the frame is narrow, is compact, and has a long lifespan.

EXAMPLE 2

Organic EL Display

Next, an organic EL display 101 as another example of an organic EL device will be described with reference to FIG. 16.

Figure 16:
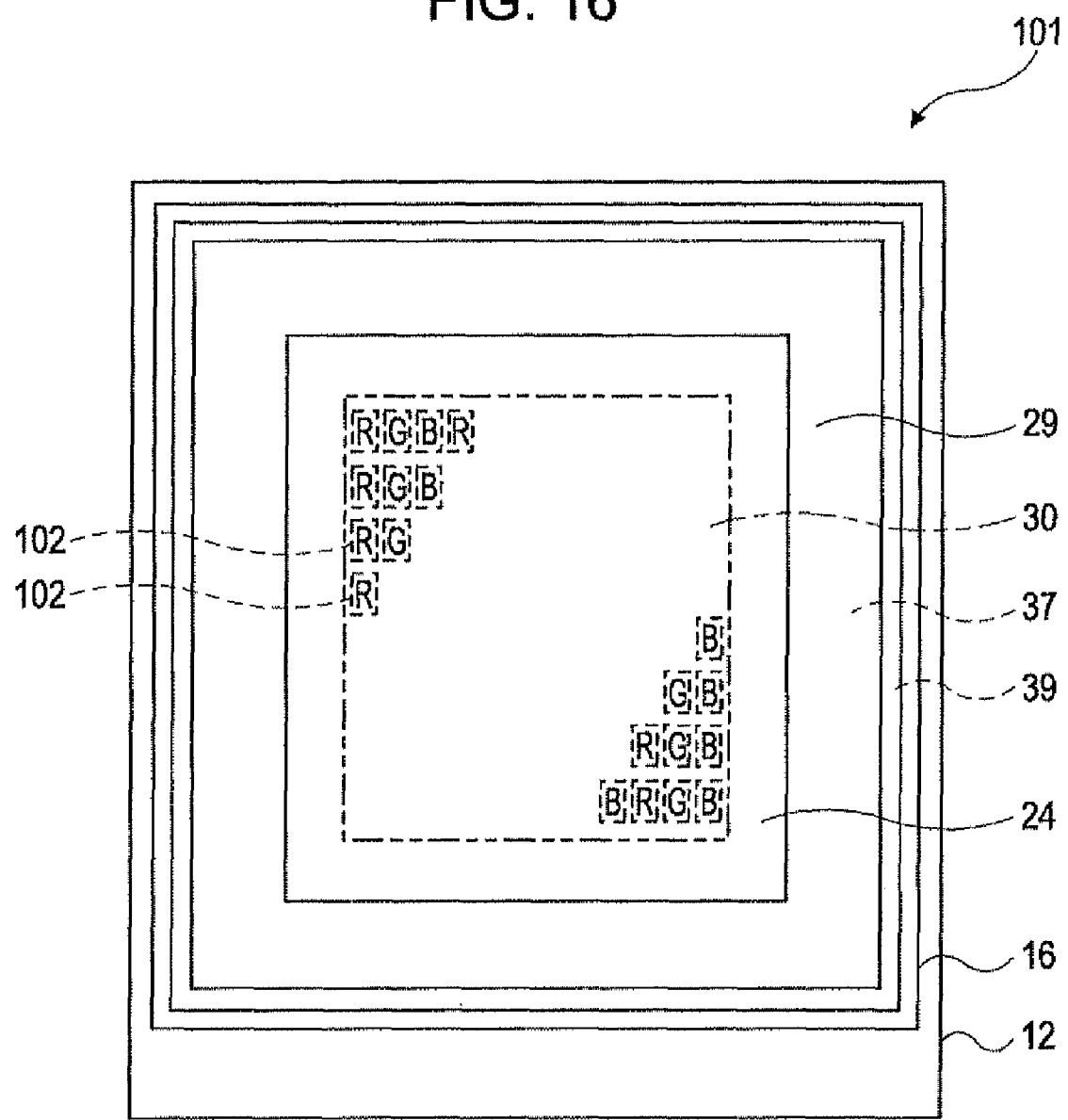
FIG. 16 is a plan view of an organic EL display according to Example 2.

FIG. 16 is a plan view of the organic EL display 101 of this example. Referring to the planar configuration shown in FIG. 16, the organic EL display 101 has at the center of a rectangular substrate 12 a display region 30 where a plurality of pixels 102 are arranged in a matrix in plan view. An absorbent 24 is formed to cover the display region 30. A sealing member 29 having a rectangular frame shape is at least partially formed in a concave portion 37 and a convex portion 39 to surround the display region 30 and the absorbent 24. A sealing substrate 16 is disposed so as to planarly cover the display region 30, the absorbent 24, and the sealing member 29.

That is, the organic EL display 101 is a display device that has the same basic configuration as the organic EL device 11 of the foregoing embodiment. The display region 30 where the pixels 102 are arranged, each pixel having an organic EL element corresponding to the light-emitting element 14 of the organic EL device 11 is sealed by the sealing member 29.

A gap 48 (see FIG. 8B) is provided between the absorbent 24 and the display region 30. Similarly to the foregoing embodiment, with the gap 48, water having passed through the sealing member 29 and having permeated the inside is diffused, and a load on the absorbent 24 is made uniform on the peripheral surface. Therefore, the absorbent 24 can be prevented from being locally deteriorated, and the reliability can be improved.

Similarly to the organic EL device 11 of the foregoing embodiment, the organic EL display 101 is provided with the concave portion 37 and the convex portion 39 in the sealing substrate 16 on which the sealing member 29 is provided. Therefore, the organic EL display 101 has a sealed structure provided by the sealing member 29. As a result, it is possible to provide an organic EL display that achieves good sealing performance with respect to the organic EL element 152, obtains high sealing performance even though the frame is narrow, is compact, and has a long lifespan.

EXAMPLE 3

Optical Write Head

Next, an optical write head that uses an organic EL device will be described with reference to FIGS. 17 and 18.

Figure 17:
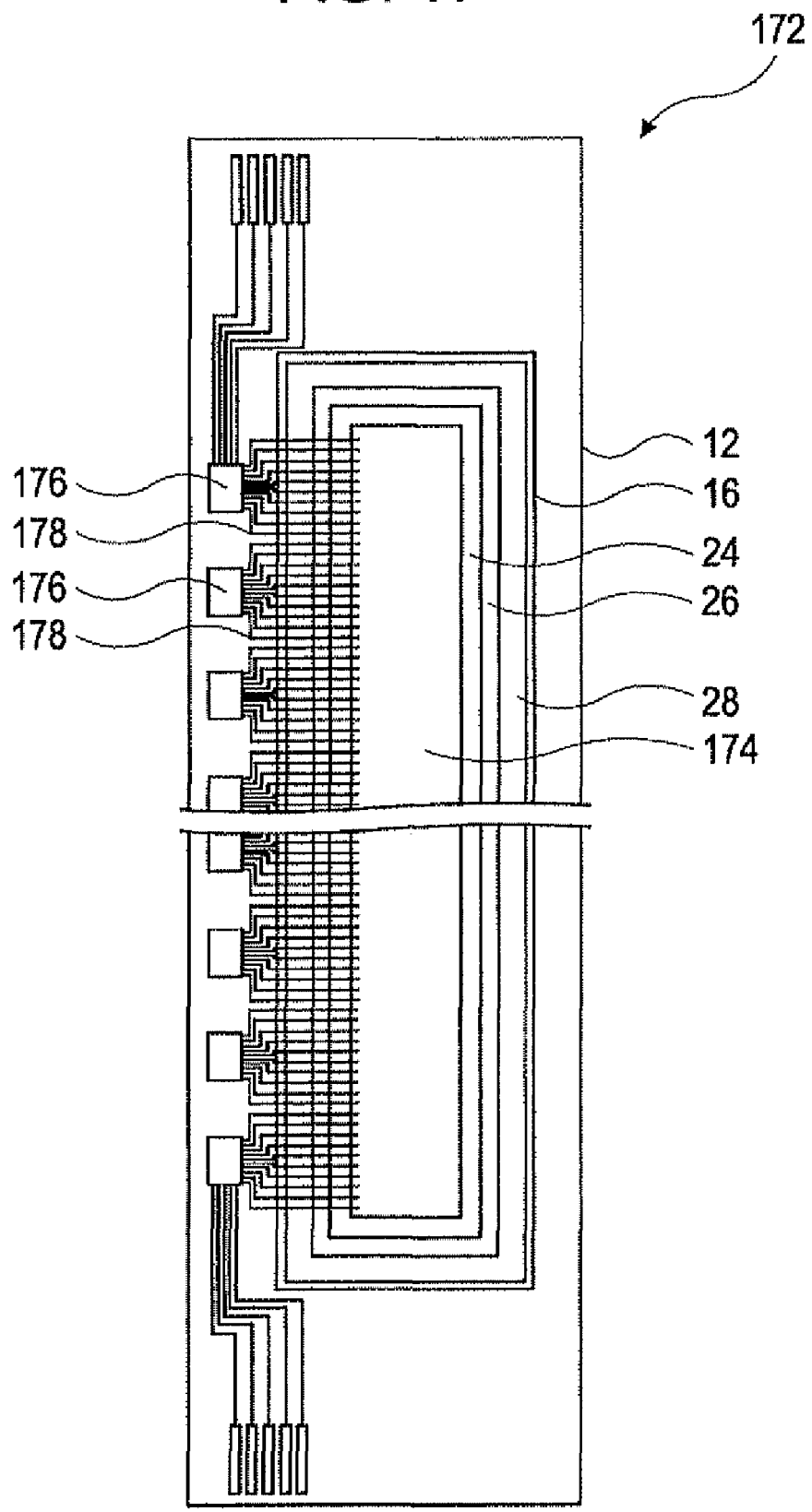
FIG. 17 is a plan view of an organic EL device for an optical write head according to Example 3.

FIG. 17 is a plan view of an organic EL device having the configuration suitable for an optical write head according to this example.

As shown in FIG. 17, a light-emitting element region 174 where organic EL elements (not shown) are arranged on a substrate 12 constituting an organic EL device 172 is provided to extend in a longitudinal of the substrate 12. A plurality of driving elements 176 are arranged along the light-emitting element region 174. Though not shown in FIG. 17, each of the organic EL elements in the light-emitting element region 174 is electrically connected to a connection line 178, which extends from a corresponding one of the driving elements 176, and is driven by an electrical signal to be supplied from the corresponding driving element 176.

The organic EL device 172 of this example has the same sealed structure as the organic EL device 10 of the foregoing embodiment. That is, a protective layer (not shown) is formed on the surface of each of the light-emitting element in the light-emitting element region 174, and an absorbent 24 is formed to cover the light-emitting element region 174. A first sealing member 26 is formed to surround the absorbent 24, and a second sealing member 28 is formed to surround the first sealing member 26. A sealing substrate 16 is adhered so as to cover the absorbent 24, the first sealing member 26, and the second sealing member 28.

Similarly to the organic EL device 10 of the foregoing embodiment, the organic EL device 172 is provided with the absorbent 24 and the first and second sealing members 26 and 28. Therefore, the organic EL device 172 has a double sealed structure provided by the first sealing member 26 and the second sealing member 28. As a results it is possible to provide an optical write head that achieves good sealing performance with respect to the light-emitting element region 174, obtains high sealing performance even though the frame is narrow, is compact, and has a long lifespan.

Figure 18:
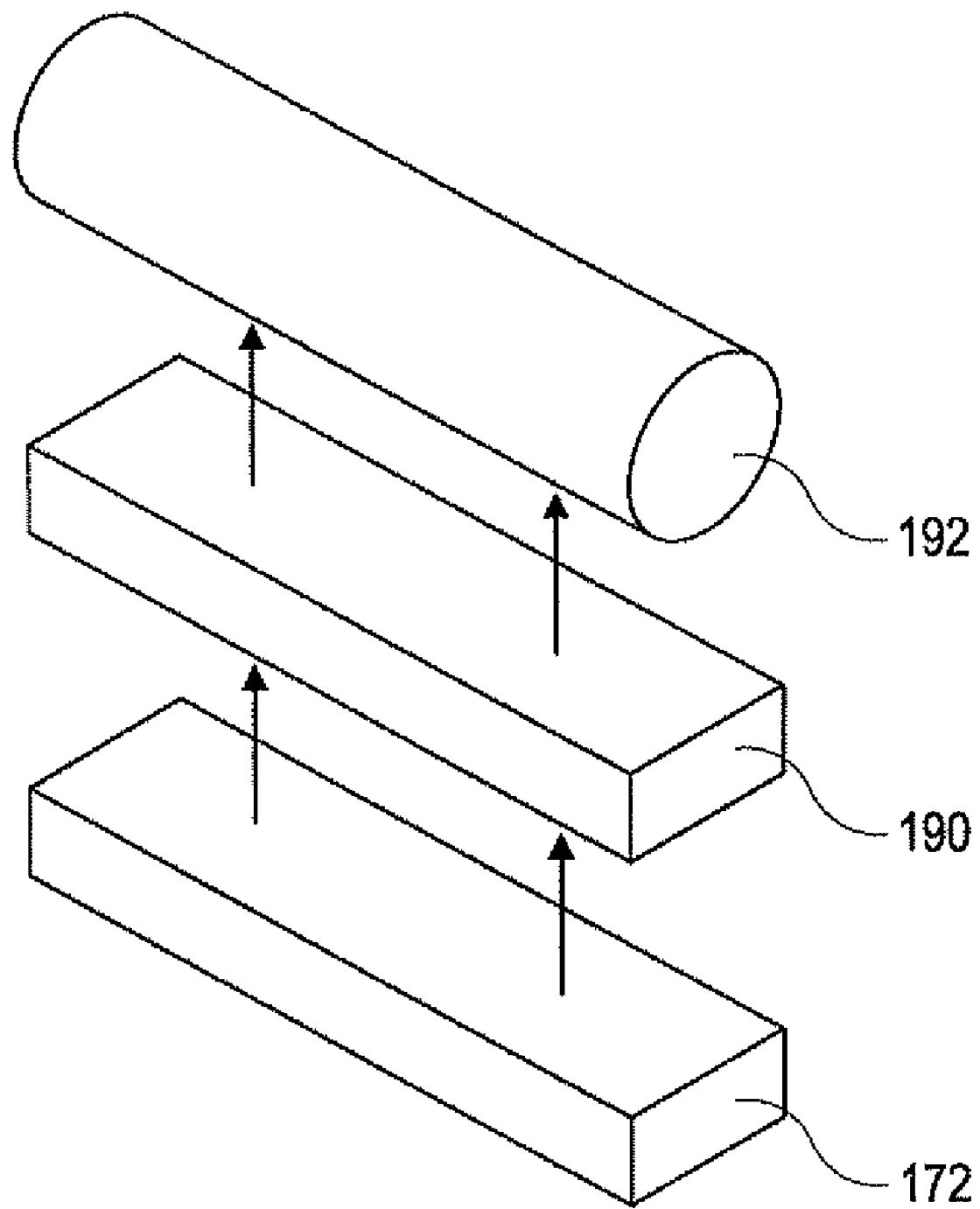
FIG. 18 is a schematic view of an optical write head according to Example 3.

FIG. 18 is a diagram showing an example where the above-described organic EL device 172 is applied to an optical write head (printer head) of an electrophotographic printer. Referring to FIG. 18, an optical system 190 is provided on the light exit side of the light organic EL device 172 (an upper side of FIG. 18), and a photosensitive drum (photoreceptor) 192 is provided above the optical system 190. The organic EL device 172 emits light toward the optical system 190, and light incident on the optical system 190 is collected by the optical system 190 and incident on the photosensitive drum 192. In this example, good sealing performance with respect to the light-emitting element 14 can be achieved, and the reliability of an electrophotographic printer can be improved.

EXAMPLE 4

Optical Write Head

Next, an optical write head that uses an organic EL device will be described with reference to FIG. 19.

Figure 19:
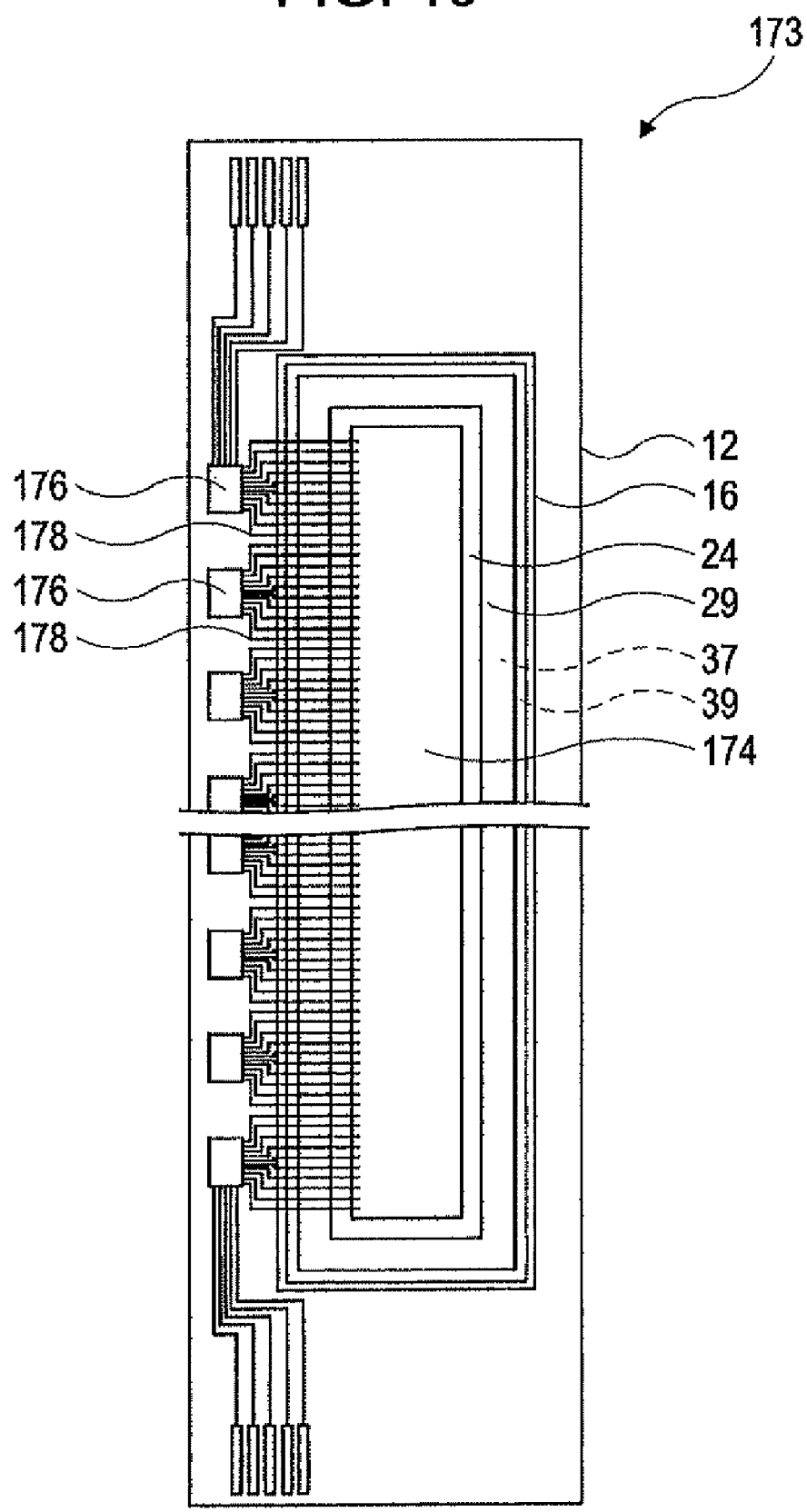
FIG. 19 is a plan view of an organic EL device for an optical write head according to Example 4.

FIG. 19 is a plan view of an organic EL device having the configuration suitable for an optical write head according to this example.

As shown in FIG. 19, the organic EL device 173 of this example also has the same sealed structure as the organic EL device 11 of the foregoing embodiment. That is, a protective layer (not shown) is formed on the surface of each of the organic EL elements in a light-emitting element region 174, and an absorbent 24 is formed to cover the light-emitting element region 174. A sealing member 29 is at least partially formed in a concave portion 37 and a convex portion 39 to surround the absorbent 24. A sealing substrate 16 is adhered so as to cover the absorbent 24 and the sealing member 29.

Similarly to the organic EL device 11 of the foregoing embodiment, the organic EL device 173 having the above-describe configuration is provided with the concave portion 37 and the convex portion 39 in the sealing substrate 16 on which the sealing member 29 is provided. Therefore, the organic EL display 173 has a sealed structure provided by the sealing member 29. As a result, it is possible to provide an optical write head that achieves good sealing performance with respect to the light-emitting element region 174, obtains high sealing performance even if the frame is narrow, is compact, and has a long lifespan.

Electronic Apparatus

Next, an example of an electronic apparatus having the organic EL display 100 or 101 of the foregoing embodiment will be described.

Figure 20:
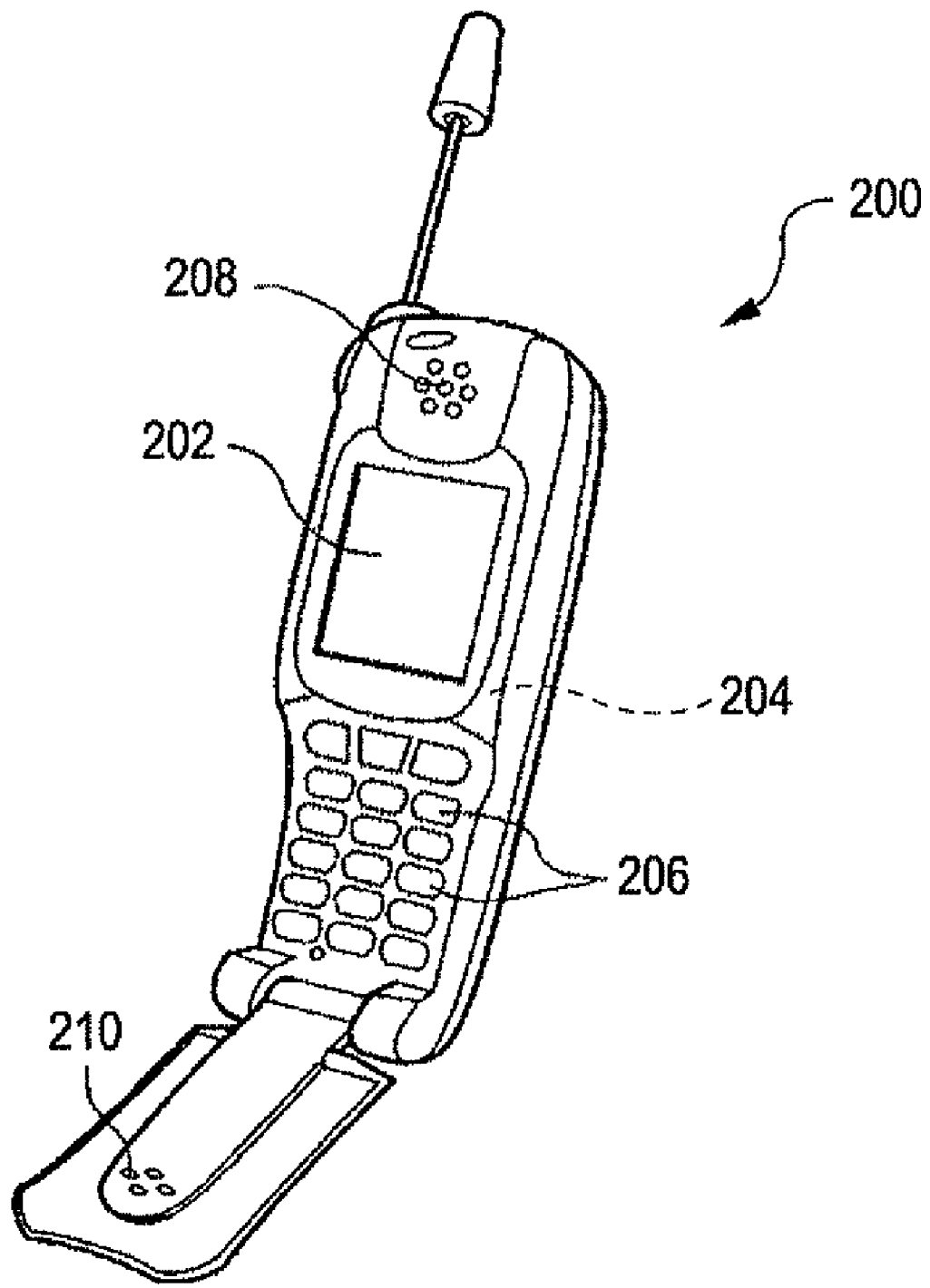
FIG. 20 is a perspective view showing an example of an electronic apparatus according to an embodiment of the invention.
Figure 21:
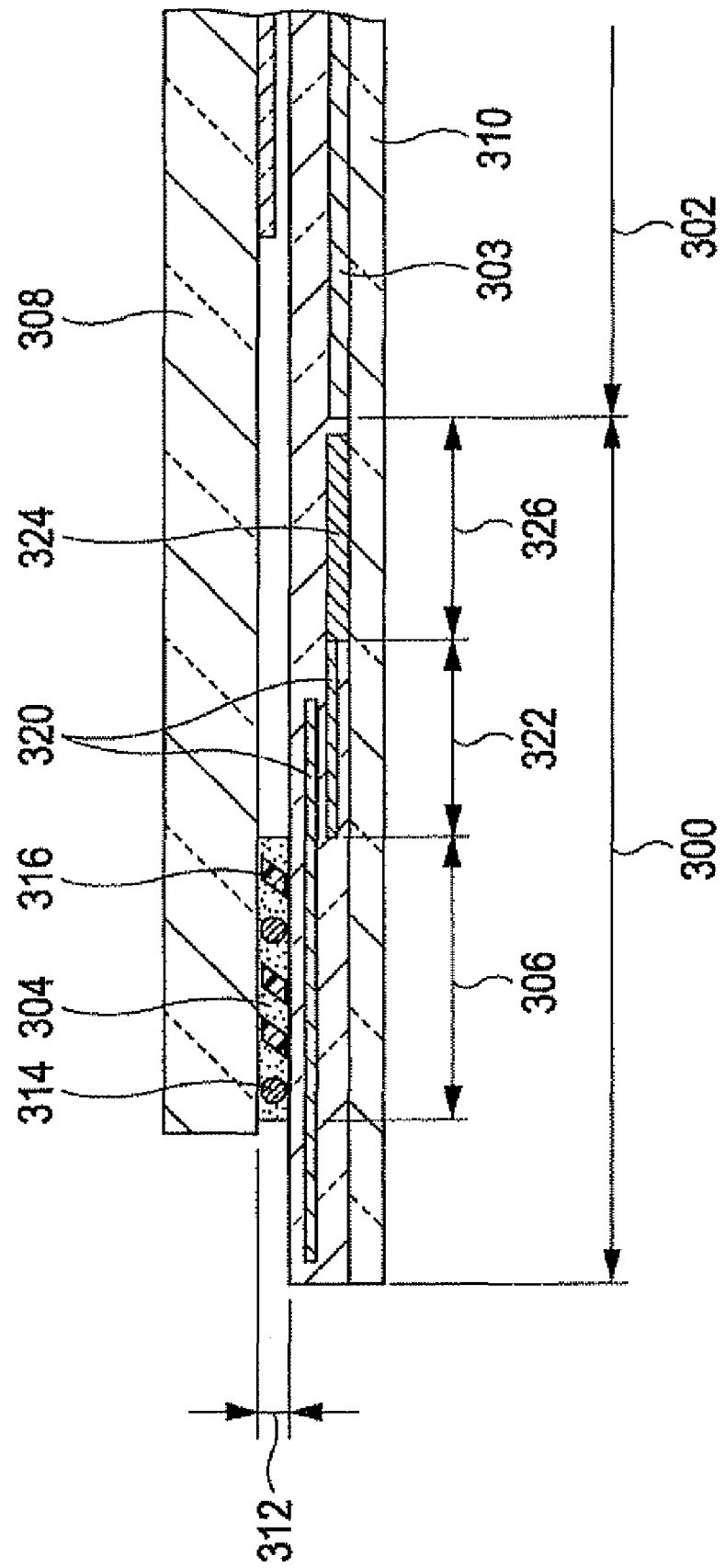
FIG. 21 is a partially enlarged sectional view of a known organic EL device.

FIG. 20 is a perspective view showing an example of a mobile phone according to this embodiment. A mobile phone 200 shown in FIG. 20 includes a display unit 202 that uses the organic EL display 100 or 101 of the foregoing embodiment, a control unit 204 that controls the display unit 202, an operation button group 206, a receiver 208, and a transmitter 210.

The electronic apparatus shown in FIG. 20 includes the organic EL display 100 of the foregoing embodiment. Therefore, with the double sealed structure provided by the first sealing member 26 and the second sealing member 28 (or in case of the organic EL display 101 of the foregoing embodiment, the sealed structure provided by the sealing member 29), it is possible to provide an electronic apparatus that achieves good sealing performance with respect to the organic EL element, obtains high sealing performance even though the frame is narrow, is compact, and has a long lifespan. An electronic apparatus to which the organic EL display 100 or 101 is applied is not limited to the mobile phone. For example, the organic EL display 100 or 101 of the foregoing embodiment may be used as display devices of various electronic apparatuses. Examples of the electronic apparatuses include a personal computer, a personal digital assistant (PDA), a digital still camera, a television, a video camera, a car navigation device, a pager, an electronic organizer, an electronic paper, an electronic calculator, a word processor, a workstation, a video phone, a POS terminal, a printer, a scanner, a copy machine, a video player, and an apparatus having a touch panel.

What is claimed is:

1. A light-emitting device comprising:
   a light-emitting element that has at least a light-emitting layer;
   a switching element that drives the light-emitting element;
   layered wiring lines that connect at least the light-emitting element and the switching element to each other;
   a substrate on which the light-emitting element, the switching element, and the layered wiring lines are provided; and
   a sealing substrate that is provided on the substrate with a plurality of sealing members interposed therebetween, and covers the light-emitting element,
   wherein the plurality of sealing members include first and second sealing members,
   the first sealing member surrounds a periphery of the light-emitting element and is provided so as to at least partially overlap each of the switching element and the layered wiring lines, and
   the second sealing member surrounds a periphery of the first sealing member.

2. The light-emitting device according to claim 1,
   wherein the second sealing member contains a granular material, and
   the first sealing member contains no granular material.

3. The light-emitting device according to claim 1,
   wherein the first sealing member contains a first granular material,
   the second sealing member contains a second granular material, and
   the first granular material has a smaller volume than that of the second granular material.

4. The light-emitting device according to claim 1,
   wherein the first sealing member is made of a material having a smaller elastic modulus than that of the second sealing member.

5. The light-emitting device according to claim 1,
   wherein the first sealing member contains a filler in order to increase a moisture-proof property or to control an elastic modulus.

6. The light-emitting device according to claim 1,
wherein at least one of the first sealing member and the second sealing member is made of thermosetting resin.

7. The light-emitting device according to claim 1,
wherein at least one of the first sealing member and the second sealing member is made of photosetting resin.

8. An electronic apparatus comprising:
the light-emitting device according to claim 1; and
a control unit that controls the light-emitting device.

* * * * *